United States Patent
Long et al.

(10) Patent No.: US 12,250,782 B2
(45) Date of Patent: Mar. 11, 2025

(54) MODULAR ELECTRICAL POWER DISTRIBUTION SYSTEM WITH MODULE DETECTION SYSTEMS AND METHODS

(71) Applicant: FLIR Belgium BVBA, Meer (BE)

(72) Inventors: Peter Long, Portsmouth (GB); Warwick Mills, Hampshire (GB); Mike Coombes, Fareham (GB); Andrew John Crees, Hampshire (GB); Graham Pare, Fareham (GB); Michael John Duncan, Fareham (GB); Joshua Wilson, Belrose (AU)

(73) Assignee: FLIR Belgium BVBA, Meer (BE)

( * ) Notice: Subject to any disclaimer, the term of this patent is extended or adjusted under 35 U.S.C. 154(b) by 650 days.

(21) Appl. No.: 17/387,967

(22) Filed: Jul. 28, 2021

(65) Prior Publication Data
US 2022/0039281 A1   Feb. 3, 2022

Related U.S. Application Data

(63) Continuation-in-part of application No. 29/744,857, filed on Jul. 31, 2020, now Pat. No. Des. 1,016,012.

(60) Provisional application No. 63/059,695, filed on Jul. 31, 2020.

(51) Int. Cl.
| | |
|---|---|
| *H05K 7/02* | (2006.01) |
| *G05B 19/042* | (2006.01) |
| *G06F 13/42* | (2006.01) |
| *H02B 1/01* | (2006.01) |

(52) U.S. Cl.
CPC ........... *H05K 7/026* (2013.01); *G05B 19/042* (2013.01); *G06F 13/4282* (2013.01); *H02B 1/01* (2013.01); *G05B 2219/2639* (2013.01); *G06F 2213/0002* (2013.01); *G06F 2213/40* (2013.01)

(58) Field of Classification Search
None
See application file for complete search history.

(56) References Cited

U.S. PATENT DOCUMENTS

| | | | |
|---|---|---|---|
| 6,904,341 B2 | 6/2005 | Kish et al. | |
| 8,531,316 B2 | 9/2013 | Velado et al. | |
| 8,944,865 B1 | 2/2015 | Krabacher et al. | |
| 9,950,778 B2 | 4/2018 | Kabel et al. | |
| 10,547,133 B1* | 1/2020 | Consoli | G02B 6/428 |
| 10,879,657 B2* | 12/2020 | Tsai | H01R 24/60 |
| 11,079,736 B2* | 8/2021 | Robl | G05B 19/042 |

(Continued)

FOREIGN PATENT DOCUMENTS

| | | |
|---|---|---|
| AU | 2018101440 A4 | 11/2018 |
| WO | WO 99/05766 | 2/1999 |

(Continued)

*Primary Examiner* — Henry Tsai
*Assistant Examiner* — Christopher A Bartels
(74) *Attorney, Agent, or Firm* — Haynes and Boone, LLP

(57) ABSTRACT

Techniques are disclosed for systems and methods associated with a modular electrical power distribution system with module detection. A modular electrical power distribution system may include a plurality of controllers, a shared serial communication bus between the plurality of controllers, and a module detection signal line coupled through the plurality of controllers. The plurality of controllers may include a master controller, a power input controller, and one or more load controllers disposed between the master controller and the power input controller.

19 Claims, 17 Drawing Sheets

(56) References Cited

U.S. PATENT DOCUMENTS

| | | | | |
|---|---|---|---|---|
| 2004/0015079 | A1* | 1/2004 | Berger | G01S 7/5208 |
| | | | | 600/443 |
| 2008/0058964 | A1* | 3/2008 | Nickerson | G05B 19/0426 |
| | | | | 700/19 |
| 2009/0276771 | A1* | 11/2009 | Nickolov | G06Q 30/04 |
| | | | | 718/1 |
| 2013/0002016 | A1 | 1/2013 | Furukawa et al. | |
| 2016/0154290 | A1* | 6/2016 | Brown | H04L 12/4625 |
| | | | | 359/275 |
| 2016/0239010 | A1* | 8/2016 | McDaniel | H02J 13/00002 |
| 2017/0077656 | A1* | 3/2017 | Beideman | H01H 37/74 |
| 2017/0128769 | A1* | 5/2017 | Long | A61G 10/02 |
| 2017/0286348 | A1* | 10/2017 | Kambhatla | G06F 13/4081 |
| 2018/0124557 | A1 | 5/2018 | Bartley et al. | |
| 2018/0150418 | A1* | 5/2018 | Steinmacher-Burow | |
| | | | | G06F 12/0817 |
| 2019/0052081 | A1 | 2/2019 | Rainbow et al. | |
| 2019/0075675 | A1 | 3/2019 | Collins et al. | |
| 2019/0237946 | A1* | 8/2019 | Jimenez | H02B 1/056 |
| 2019/0243206 | A1* | 8/2019 | Brown | H04L 12/4625 |
| 2020/0341934 | A1* | 10/2020 | Abdul Kalam | G06F 13/1673 |
| 2021/0392743 | A1* | 12/2021 | Wang | G06F 1/188 |

FOREIGN PATENT DOCUMENTS

| | | |
|---|---|---|
| WO | WO 2001/013186 A1 | 2/2001 |
| WO | WO 2007/047615 A9 | 4/2007 |
| WO | WO 2018/112661 A1 | 6/2018 |
| WO | WO 2019/192734 | 10/2019 |

* cited by examiner

MODULAR ELECTRICAL POWER DISTRIBUTION SYSTEM WITH MODULE DETECTION SYSTEMS AND METHODS

CROSS-REFERENCE TO RELATED APPLICATIONS

This application claims priority to and the benefit of U.S. Provisional Patent Application No. 63/059,695 filed Jul. 31, 2020 and entitled "MODULAR ELECTRICAL POWER DISTRIBUTION SYSTEM WITH MODULE DETECTION SYSTEMS AND METHODS," which is incorporated herein by reference in its entirety.

This application is also a continuation-in-part of U.S. Design patent application Ser. No. 29/744,857 filed Jul. 31, 2020 and entitled "POWER CONTROL SYSTEM," which is incorporated herein by reference in its entirety.

TECHNICAL FIELD

One or more embodiments of the invention relate generally to electrical power distribution systems and more particularly, for example, to a modular electrical power distribution system with module detection.

BACKGROUND

Traditional vessel power distribution systems and methods use central control panels including an array of fuses and switches that directly connect electrical loads, such as bilge pumps, wipers, horn, and other navigational and control equipment to the vessel's battery system. Currently, there is a vast array of vessels with equally vast and varied electrical specifications and requirements, which in many cases are custom and tailored to individual customers. Installation of such systems can be complicated, time consuming, and cost prohibitive. Therefore, there is a need in the art for systems and methods for a modular electrical power distribution system that addresses the deficiencies noted above, other deficiencies known in the industry, and offers an alternative to current techniques.

BRIEF SUMMARY

Techniques are disclosed for systems and methods for a modular electrical power distribution system with module detection configured to provide individually tailored and/or customized vessel power distribution to meet vessel requirements through use of interconnected and interchangeable controllers that minimize wiring and ease installation. The modular electrical power distribution system may include one or more various components to provide a modular switching (e.g., digital switching) control system to recognize and enable control of power to all equipment on a vehicle (e.g., a watercraft). In one embodiment, a modular electrical power distribution system may include a plurality of controllers, a shared serial communication bus coupled between the plurality of controllers, and a module detection signal line coupled through the plurality of controllers. The plurality of controllers may include a master controller, a power input controller, and one or more load controllers disposed between the master controller and the power input controller.

In another embodiment, a method of detecting one or more characteristics of a modular electrical power distribution system including a plurality of controllers in communication with one another via a shared serial communication bus and a module detection signal line is provided. The method may include sending, via the module detection signal line, a first module detection signal to a first load controller of the plurality of controllers and receiving, via the shared serial communication bus, a first module identification signal from the first load controller. The method may include receiving, via the shared serial communication bus, a second module identification signal from a second load controller of the plurality of controllers. The method may also include receiving, via the shared serial communication bus, a third module identification signal from a power input controller of the plurality of controllers.

In another embodiment, a method of detecting one or more modules of a modular electrical power distribution system including a plurality of controllers in communication with one another via a shared serial communication bus and a module detection signal line is provided. The method may include receiving, by a controller of the plurality of controllers and via the module detection signal line, an input detection signal from a preceding controller of the plurality of controllers along the shared serial communication bus; sending, by the controller via the shared serial communication bus, a module identification signal to a master controller; and sending, by the controller over the module detection signal line, an output detection signal to a succeeding controller of the plurality of controllers along the shared serial communication bus.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

DETAILED DESCRIPTION

Figure 1:
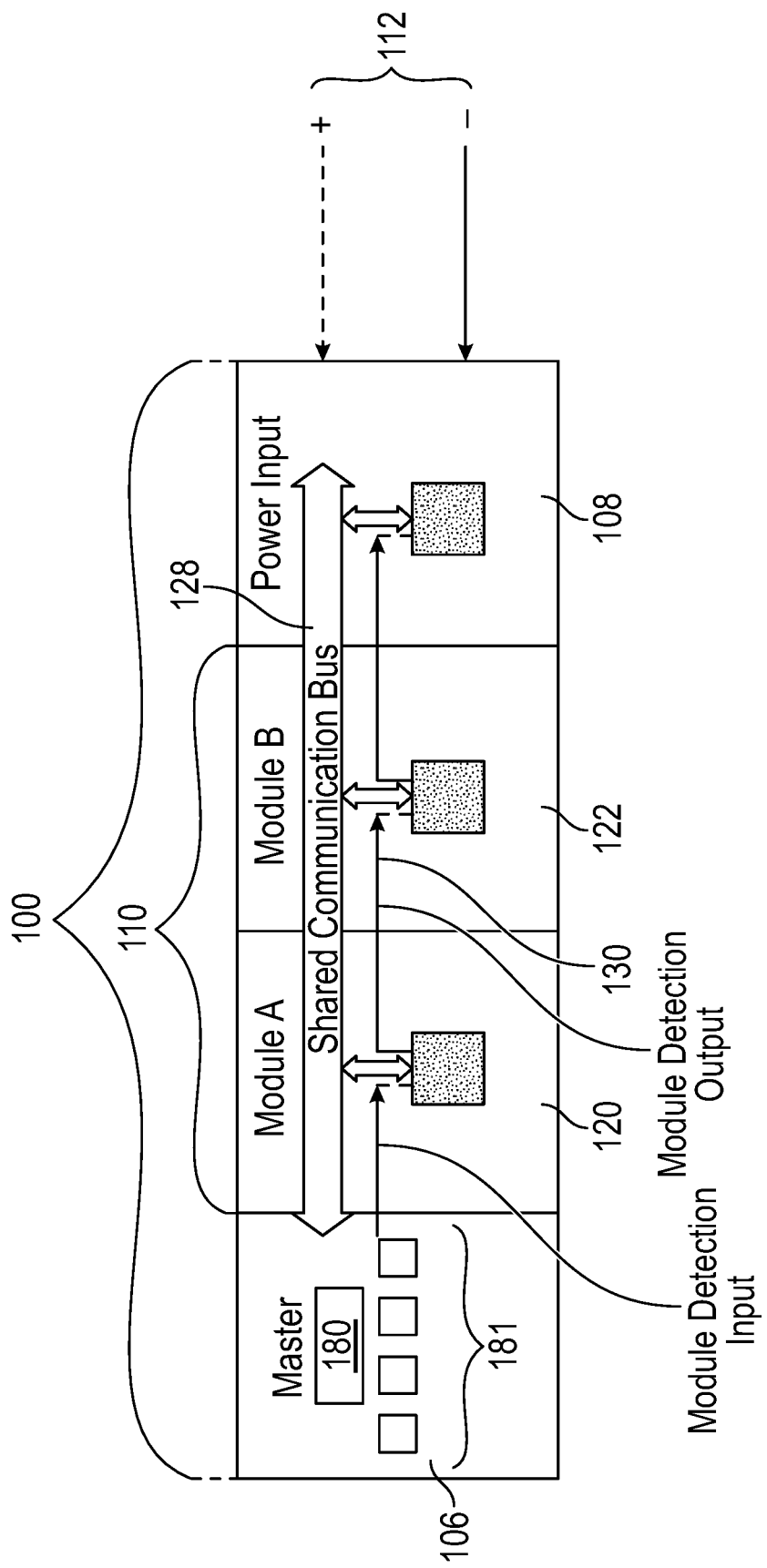
FIG. 1 illustrates a schematic diagram of a modular electrical power distribution system in accordance with an embodiment of the disclosure.
Figure 2:
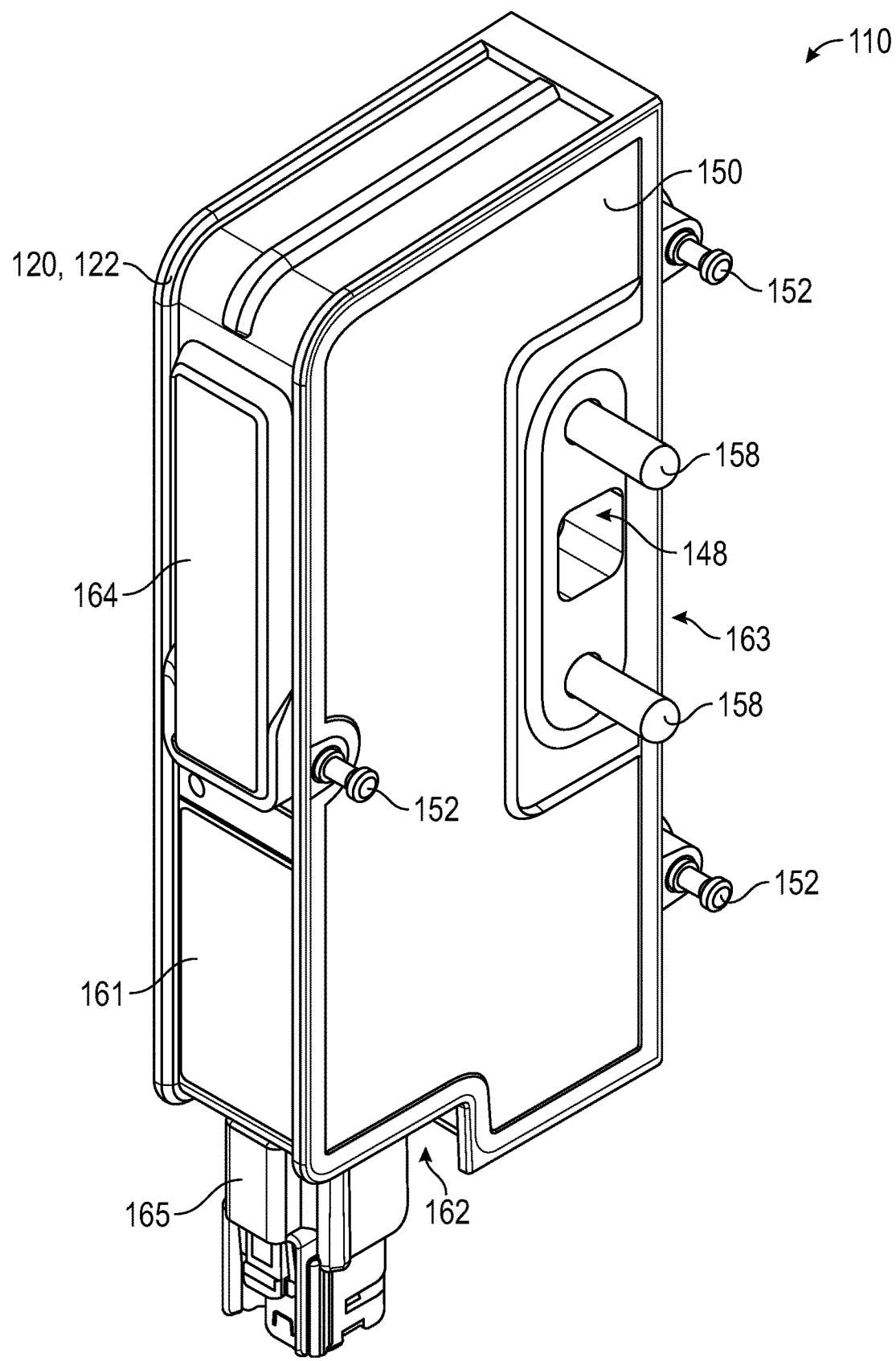
FIGS. 2-6 illustrate various views of a load controller of an electrical power distribution system in accordance with embodiments of the disclosure.

In accordance with various embodiments of the present disclosure, a modular electrical power distribution system is provided that allows a user to tailor the system to meet one or more power distribution or electrical load requirements through use of interconnected and physically interchangeable or modular controllers that minimize wiring and ease installation. The modular electrical power distribution system may include one or more various components or controllers to provide a modular switching (e.g., digital switching) control system to recognize and enable control of power to all equipment on a vehicle (e.g., a watercraft). For example, the modular electrical power distribution system may include one or more modules, such as any of a power module, a bridge module, a remote module, and/or a master module as shown and described in related U.S. Design patent application Ser. No. 29/744,857 filed Jul. 31, 2020, the disclosure of which is incorporated by reference herein in its entirety. In some embodiments, the modular electrical power distribution system may include a master controller, a power input controller, and a variable number of load controllers, or other controllers, in any number or combination. For instance, the modular electrical power distribution system may include a plurality of load controllers physically and electrically coupled or connected between the master controller and the power input controller. The modular electrical power distribution system can accommodate any suitable number of load controllers disposed between the master controller and the power input controller to match or generally match the capability of the modular electrical power distribution system to specific vessel requirements.

In various embodiments, a master controller may be configured to sense one or more characteristics of other controllers of the modular electrical power distribution system, and control power distribution to, or switching between, one or more load controllers, such as controlling when each load controller switches on or off, how much electrical power is distributed to each load controller, and the like. Such configurations may provide user programmable operation, variable fusing, and power monitoring of the various components of the modular electrical power distribution system. In various embodiments, the controllers of the modular electrical power distribution system may communicate with one another via a shared serial communication bus and a module detection signal line, as described herein.

The various controllers of the disclosed system may be interconnected in a modular fashion. For example, each load controller may include one or more identical physical structures and electrical connections that interface with both a preceding controller and a succeeding controller in a system stack (e.g., including the master controller, the power input controller, and any number of load controllers disposed therebetween and succeeding the master controller). The master controller may also include one or more similar and/or identical structures and electrical connections that interface with a succeeding load controller. Similarly, the power input controller may include one or more similar and/or identical structures and electrical connections that interface with a preceding load controller. The modularity of the system may provide substantial flexibility, ease of installation, and ease of modification. For instance, a range of different modules/controllers may be interconnected offering differing capability to match the modular electrical power distribution system to specific power leg and/or vessel requirements. One or more modules/controllers may also be added to or removed from the modular electrical power distribution system to modify the modular electrical power distribution system to changing conditions and/or requirements. The various controllers of the modular electrical power distribution system may be configured to fit easily together in a modular fashion, as described herein.

FIG. 1 illustrates a schematic diagram of a modular electrical power distribution system 100 in accordance with an embodiment of the disclosure. Modular electrical power distribution system 100 (or simply "power distribution system") may be configured to distribute or otherwise control electrical power provided to one or more electrical loads, such as bilge pumps, galley appliances, navigational equipment, control equipment, or other devices of a marine vessel or ship. For example, modular electrical power distribution system 100 may transmit one or more signals to a multitude of intelligent switching systems that electronically connect loads to the ship's battery and/or power generating and/or storage system. Modular electrical power distribution system 100 can also receive one or more signals from the intelligent switching systems to gather data regarding the switching of loads, sensor data including load characteristics, or events requiring action or further intervention. Modular electrical power distribution system 100 is also modular, allowing modular electrical power distribution system 100 to be tailored to meet the specific power requirements of an individual ship or vessel by combining several predetermined modules or controllers to construct modular electrical power distribution system 100. In addition, the ship or vessel can accommodate two or more interconnected distribution systems to match capability to specific areas within the ship or vessel.

These and other features described herein may minimize the amount of wiring needed to connect modular electrical power distribution system 100 and ease installation. In addition, modular electrical power distribution system 100 may also provide for user programmable operation, variable fusing, and power monitoring, among other features. The modularity of modular electrical power distribution system 100 may also provide substantial flexibility, such as due to a range of modules/controllers offering differing capability. Each of these features are described in detail below.

Referring to FIG. 1, modular power distribution system 100 includes a plurality of connected modules or controllers. For example, the plurality of controllers may be stacked side-by-side or stacked on top of one another, with each controller connected to one or more adjacent controllers through a direct connection (i.e., without loose wiring running between the various controllers, etc.). Specifically, each controller may include one or more connection structures that interface with the corresponding connection structures of an adjacent controller, such as through corresponding male and female pin, latch, or other connection structures, as explained in detail below. As result, wiring between the various controllers of modular electrical power distribution system 100 may be reduced or eliminated, thereby easing installation and reducing connection complexity.

Modular electrical power distribution system 100 may be constructed from a variable number of controllers or control modules. For example, modular electrical power distribution system 100 may include a master controller 106, a power input controller 108, and one or more load controllers 110 disposed between master controller 106 and power input controller 108. Master controller 106 may include one or more processors, logic devices, or other electrical and/or electronic structures configured to control electrical power distribution to, or switching between, the one or more load controllers 110 and power input controller 108. For instance, master controller 106 may control when each load controller 110 switches on or off, how much electrical power is distributed to/by each load controller 110, and the like. In some embodiments, master controller 106 may include a logic device configured to receive, send, and process one or more signals and/or data, as explained below. Master controller 106 may also gather or aggregate data regarding operation of power input controller 108 and/or load controllers 110. Master controller 106 may use the gathered or aggregated data to adjust operation of load controllers 110 and/or power input controller 108. The data may also be provided to a display or an external device for viewing and/or analysis of the data. For example, the data may be transmitted to a user interface for viewing by a user. Master controller 106 may also be configured to permit user adjustment of one or more operating characteristics of power input controller 108 and/or load controllers 110, such as through user input provided to a user interface integrated with modular electrical power distribution system 100 and/or a display or external device in wired and/or wireless communication with modular electrical power distribution system 100.

Power input controller 108 may be connectable to a power source 112. Power input controller 108 may include one or more processors, logic devices, or other electrical and/or electronic structures configured to filter, condition, rectify, or otherwise modify the electrical power provided to modular electrical power distribution system 100 by power source 112. In some embodiments, power input controller 108 may include a logic device configured to receive, send, and process one or more signals and/or data, as explained below. Depending on the application, power source 112 may be an alternating current (AC) power source or a direct current (DC) power source. Examples of power source 112 may include one or more batteries, capacitors, generators, alternators, or other electrical power source, or any combination thereof.

Each load controller 110 may control the electrical power supplied to one or more electrical loads connected to modular electrical power distribution system 100. For example, one or more electrical loads may be connected to a load controller 110 (e.g., module A and/or B), with load controller 110 configured to control one or more characteristics of the electrical power supplied to the one or more electrical loads connected thereto. In such embodiments, each load controller 110 may receive electrical power (e.g., from power input controller 108) and distribute or otherwise control the electrical power provided to one or more electrical loads. In some embodiments, each load controller 110 may include one or more processors, logic devices, or other electrical and/or electronic structures configured to filter, condition, rectify, or otherwise modify the electrical power provided to the electrical load(s). In some embodiments, each load controller 110 may include a logic device configured to receive, send, and process one or more signals and/or data, as explained below.

Modular electrical power distribution system 100 may include a plurality of load controllers 110 coupled physically and/or electrically to and disposed between master controller 106 and power input controller 108. For example, modular electrical power distribution system 100 may include a first load controller 120 and a second load controller 122. As shown, first load controller 120 may be disposed between master controller 106 and second load controller 122, with second load controller 122 disposed between first load controller 120 and power input controller 108. In one or more embodiments, first load controller 120 and second load controller 122 may be stacked side-by-side, although other configurations are contemplated. In some embodiments, first load controller 120 and second load controller 122 may be stacked side-by-side with master controller 106 and power input controller 108.

First load controller 120 may be configured to control one or more first electrical loads, and second load controller 122 may be configured to control one or more second electrical loads. The first electrical load and the second electrical load may be different systems, subsystems, or components of a vessel or ship. For example, the first electrical load may be one or more components of a first system or subsystem (e.g., a navigational system or subsystem) and the second electrical load may be one or more components of a second system of subsystem (e.g., a propulsion control system or subsystem, or a galley appliance, such as a stove or refrigerator). In some embodiments, the first electrical load and the second electrical load may be separate components of a single system of subsystem. For example, the first electrical load may be a first component of a system or subsystem and the second electrical load may be a second component of the same system or subsystem (e.g., first and second components of a navigational system or subsystem, first and second components of a control system or subsystem, etc.).

In such embodiments, master controller 106 may manage electrical power delivery to each of load controllers 110. For instance, master controller 106 may switch power delivery to first load controller 120 and/or second load controller 122 on or off. In some embodiments, master controller 106 may monitor and/or regulate the amount of electrical power provided to the electrical loads via load controllers 110. For example, master controller 106 may combine or fuse power delivery to a single electrical load through both first load controller 120 and second load controller 122. In some embodiments, master controller 106 may control power delivery to one of load controllers 110 at the sacrifice of one or more other load controllers 110. For instance, if the available power from power source 112 is relatively low, or if additional power is needed for a component connected to a load controller 110, master controller 106 may turn off one or more load controllers 110 connected to non-essential equipment or components to maintain or provide additional power to one or more load controllers 110 connected to essential equipment or components.

In some embodiments, first load controller 120 and second load controller 122 may have differing or similar control characteristics or capabilities. For example, first load controller 120 may have a first load monitoring and/or control capability and second load controller 122 may have a second load monitoring and/or control capability different from or similar to the first capability. The first capability may include a first switching and/or carrying rating of first load controller 120, such as a first voltage, amperage, or other rating of first load controller 120. The second capability may include a second switching and/or carrying rating of second load controller 122, such as a second voltage, amperage, or other rating of second load controller 122. In additional embodiments, the first and second load monitoring and/or control capabilities may include programmable fusing (e.g., with programmable trip current levels), DC and/or AC voltage, current, and/or power monitoring, power surge protection characteristics, and/or other variable and/or varied load monitoring and/or control capabilities. As a result, modular electrical power distribution system 100 may have a range of controllers or modules offering differing load monitoring and/or control capability to provide substantial flexibility in tailoring modular electrical power distribution system 100 to vessel requirements.

Although a first load controller 120 and a second load controller 122 are shown in FIG. 1, any number of load controllers 110 are contemplated. For example, modular electrical power distribution system 100 may include a single load controller 110 or more than two load controllers 110 based on system requirements. In that regard, modular electrical power distribution system 100 may be modular to adapt, adjust, or tailor modular electrical power distribution system 100 to a particular vessel or ship. For example, the number of load controllers 110 may be set based on the power distribution needs of the vessel. In some embodiments, one or more load controllers 110 may be added to an existing modular power distribution system 100 if additional equipment is added to the vessel, but without necessitating complete replacement of the existing modules of modular power distribution system 100. In like manner, one or more load controllers 110 may be removed from modular power distribution system 100 if equipment is removed from the vessel.

The modular design of modular electrical power distribution system 100 may allow the minimum number of components to be installed to satisfy the power control requirements of the vessel, such as to control power to all equipment on the vessel using the minimum number of components. In addition, the modular design may allow a user to individually tailor modular electrical power distribution system 100 to meet vessel requirements by constructing or assembling modular electrical power distribution system 100 from predetermined modular controllers or modules. For example, any number of interconnected modules or controllers may be assembled together to match or generally match capability of modular electrical power distribution system 100 to vessel requirements.

With continued reference to FIG. 1, modular electrical power distribution system 100 may include a shared serial communication bus 128 coupled between the plurality of controllers. Shared serial communication bus 128 may be implemented as a shared communication channel or pathway that transmits data between the plurality of controllers. For example, the controllers can exchange or share status or other information via shared serial communication bus 128, such as identification, acknowledgement, or configuration information, as explained below. In some embodiments, a controller may pass through information or data received from a first adjacent controller to a second adjacent controller, or a controller may process the information or data received from the first adjacent controller before passing the information or data to the second adjacent controller. For example, a controller may add information or data to a data packet being passed down the line of controllers, modify the data packet as the data packet is being passed down the line of controllers, or the like.

Shared serial communication bus 128 may be implemented as a wired bus extending through the plurality of controllers when the controllers are physically connected to each other, such as in a side-by-side arrangement. For instance, connection of master controller 106 with first load controller 120 may create at least a portion of shared serial communication bus 128 between master controller 106 and first load controller 120. Connecting second load controller 122 to first load controller 120 may extend shared serial communication bus 128 between master controller 106, first load controller 120, and second load controller 122. Similarly, connecting power input controller 108 with second load controller 122 may extend shared serial communication bus 128 between master controller 106, first load controller 120, second load controller 122, and power input controller 108. Connecting additional controllers to modular electrical power distribution system 100 may extend shared serial communication bus 128 via modular connection of the additional controllers to modular electrical power distribution system 100. In related embodiments, master controller 106 may be configured to communicate with other devices, including other master controllers 106, via a wired and/or wireless communication channel that effectively extends shared serial communication bus 128 to other controllers not physically connected to modular electrical power distribution system 100.

In some embodiments, modular electrical power distribution system 100 may include a module detection signal line 130 coupled through the plurality of controllers. Module detection signal line 130 may be a shared pathway dedicated for specific data or signals. For example, one or more module detection signals may be sent and received via module detection signal line 130 to enable master controller 106 to determine or learn the type of controllers within modular electrical power distribution system 100 (e.g., the stack), the position of each controller within the stack, and the total number of controllers within the stack, and/or other controller stack characteristics, as described herein. In this regard, module detection inquiries may be sent via module detection signal line 130 to the various controllers of modular electrical power distribution system 100. In some embodiments, module detection signal line 130 may loop through the plurality of controllers. For instance, module detection signal line 130 may extend through the plurality of controllers such that the one or more module detection signals loop from master controller 106, through the plurality of controllers, and back to master controller 106, or the like.

Module detection signal line 130 may extend through the plurality of controllers via physical and/or electrical interconnection of the controllers. For example, connection of master controller 106 with first load controller 120 may create module detection signal line 130 between master controller 106 and first load controller 120. Connecting second load controller 122 to first load controller 120 may extend module detection signal line 130 between master controller 106, first load controller 120, and second load controller 122. In like manner, connecting power input controller 108 to second load controller 122 may extend module detection signal line 130 between master controller 106, first load controller 120, second load controller 122, and power input controller 108. Connecting additional controllers to modular electrical power distribution system 100 may extend module detection signal line 130 via modular connection of the additional controllers to modular electrical power distribution system 100.

FIGS. 2-6 illustrate various views of a load controller 110 (e.g., first load controller 120 or second load controller 122) in accordance with an embodiment of the disclosure. Referring to FIGS. 2-6, each load controller 110 may include many configurations providing for modular attachment or connection of the load controller to modular electrical power distribution system 100. For example, each load controller 110 may include a first electrical connector 136 and a second electrical connector 138. The first electrical connector 136 may be configured to interface with an electrical connector of a preceding controller of modular electrical power distribution system 100. As described herein, the preceding controller may be any prior controller (e.g., an immediately preceding controller or any prior controller) along shared serial communication bus 128, such as along shared serial communication bus 128 from master controller 106 to power input controller 108. For example, the first electrical connector 136 of first load controller 120 may interface with master controller 106, the first electrical connector 136 of second load controller 122 may interface with first load controller 120, and so on. The first electrical connector 136 may be any suitable I/O connector, such as a multi-pin connector (e.g., a 6-pin connector, an 8-pin connector, etc.), for example. The first electrical connector 136 may be a male pin connector. Engagement of the first electrical connector 136 with a preceding controller may at least partially define module detection signal line 130 and/or shared serial communication bus 128 with the preceding controller.

The second electrical connector 138 may be configured to interface with an electrical connector of a succeeding controller of modular electrical power distribution system 100. As described herein, the succeeding controller may be any subsequent controller (e.g., an immediately succeeding controller or any subsequent controller) along shared serial communication bus 128, such as along shared serial communication bus 128 from master controller 106 to power input controller 108. For instance, the second electrical connector 138 of first load controller 120 may interface with second load controller 122, the second electrical connector 138 of second load controller 122 may interface with power input controller 108, and so on. Like the first electrical connector 136, the second electrical connector 138 may be any suitable I/O connector, such as a multi-pin connector (e.g., a 6-pin connector, an 8-pin connector, etc.), for instance. The second electrical connector 138 may be a female pin connector. Engagement of the second electrical connector 138 with a succeeding controller may at least partially define module detection signal line 130 and/or shared serial communication bus 128 with the succeeding controller.

In some embodiments, the first electrical connector 136 of a succeeding controller may interface with the second electrical connector 138 of a preceding controller. For example, the first electrical connector 136 of second load controller 122 may interface with the second electrical connector 138 of first load controller 120, and so on. In some embodiments, the first electrical connector 136 and the second electrical connector 138 may include or be positioned on/within male and female structures. For instance, the first electrical connector 136 may include or be positioned on a post 142 extending from a first side 144 of each load controller 110. The second electrical connector 138 may include or be positioned within a receptacle 148 disposed in an opposite second side 150 of each load controller 110. The post 142 and receptacle 148 may be aligned so that modular connection of adjacent controllers aligns the controllers side-by-side, for example.

In some embodiments, each load controller 110 may include one or more bosses 152 extending from one side (e.g., from the second side 150) of load controller 110 and one or more apertures 154 defined in an opposite side (e.g., the first side 144) of load controller 110 to further align and/or secure adjacent controllers together. For example, the bosses 152 may be received and secured within the apertures 154 of an adjacent controller, such as the bosses 152 of first load controller 120 received within the apertures 154 of second load controller 122, to align and secure the controllers together. In some embodiments, the bosses 152 may be secured within the apertures 152 via a mechanical fastener or other securement means, such as to prevent or limit disengagement of first load controller 120 from second load controller 122. As shown, the bosses 152 and apertures 154 may be positioned along a perimeter of load controller 110 to secure adjacent controllers together, such as two bosses 152 and corresponding apertures 154 positioned along a rear of load controller 110 and a single boss 152 and corresponding aperture 154 positioned along a front of the load controller 100 as shown, although other configurations are contemplated.

With continued reference to FIGS. 2-6, each load controller 110 may include a pair of prongs 158 and a pair of prong receptacles 160. The prongs 158 may be configured to interface with a succeeding controller of modular electrical power distribution system 100. For example, the prongs 158 of first load controller 120 may interface with second load controller 122, the prongs 158 of second load controller 122 may interface with power input controller 108, and so on. As shown, the prongs 158 may extend from the second side 150 of each load controller 110. In some embodiments, the prongs 158 may extend from the second side 150 adjacent to the second electrical connector 138. Depending on the application, the prongs 158 may flank the second electrical connector 138, such as in alignment with the second electrical connector 138, although other configurations are contemplated.

The prong receptacles 160 may be configured to interface with a preceding controller of modular electrical power distribution system 100. For instance, the prong receptacles 160 of first load controller 120 may interface with master controller 106, the prong receptacles 160 of second load controller 122 may interface with first load controller 120, and so on. In some embodiments, the prongs 158 may be configured to interface with the prong receptacles 160 of a succeeding controller, such as the prongs 158 of first load controller 120 interfacing with the prong receptacles 160 of second load controller 122, and the like. As shown, the prong receptacles 160 may be defined in the first side 144 of each load controller 110. In some embodiments, the prong receptacles 160 may be defined in the first side 144 adjacent to the first electrical connector 136. Depending on the application, the prong receptacles 160 may flank the first electrical connector 136, such as in alignment with the first electrical connector 136, although other configurations are contemplated.

The prongs 158 may interface with the prong receptacles 160 of a succeeding controller in many configurations. As one example, the prong receptacles 160 may at least partially receive the prongs 158 of the preceding controller. For instance, the prongs 158 of first load controller 120 may be inserted at least partially within the prong receptacles 160 of second load controller 122, and so on. The prongs 158 and prong receptacles 160 may be aligned so that modular connection of adjacent controllers aligns the controllers, such as aligning the controllers side-by-side.

Engagement of the prongs 158 with the prong receptacles 160 of a succeeding controller may at least partially define an electrical connection between the adjacent controllers, such as an electrical connection capable of conveying the full electrical power provided by power source 112 and monitored, switched, and/or distributed by the various controllers of modular electrical power distribution system 100. In some embodiments, engagement of the prongs 158 with the prong receptacles 160 of a succeeding controller may at least partially define module detection signal line 130 and/or shared serial communication bus 128 between adjacently connected controllers. In other embodiments, the prongs 158 and prong receptacles 160 may function primarily or solely as alignment features to align a connection between adjacent controllers, such as to align the connection of the first electrical connector 136 and the second electrical connector 138 of adjacent controllers.

With continued reference to FIGS. 2-6, each load controller 110 may be a cuboid shaped module with a front face 161, a bottom face 162, and a rear face 163, among other faces, between the first side 144 and the second side 150 of load controller 110. The bosses 152 may be positioned at or near the perimeter of the second side 150 of load controller 110, such as one or more bosses 152 (e.g., two bosses 152) positioned at the perimeter of the second side 150 near the rear face 163 and one or more bosses 152 (e.g., a single boss 152) positioned at the perimeter of the second side 150 near the front face 161. In some embodiments, one or more bosses 152 may extend from the front face 161 or the rear face 163. The apertures 154 may be positioned accordingly along the perimeter of the first side 144 of load controller 110, such as at the perimeter of the first side 144 near the rear face 163 and the first face. In some embodiments, the structural connection features of load controller 110 may be closer to the perimeters of the side faces, with the communication or electrical connection features of load controller 110 closer to the center of the side faces.

The front face 161, bottom face 162, and/or rear face 163 may include one or more features for convenience or use. For example, the front face 161 may include a display 164 or other indicator that provides status information of load controller 110. Status information may include, for example, a connection status, a power status, a fault status, an error status, and/or a mode status, among others, of load controller 110. In some embodiments, the display 164 may render one or more codes, messages, or graphical representations.

The bottom face 162 may include one or more connection adapters 165 for connection to one or more electrical loads. For example, the bottom face 162 may include one connection adapter 165 for connection to a single electrical load controlled by load controller 110, two connection adapters 165 for connection to two electrical loads controlled by load controller 110, one connection adapter 165 for connection to a plurality of electrical loads controlled by the load controller, or the like.

Figure 3:
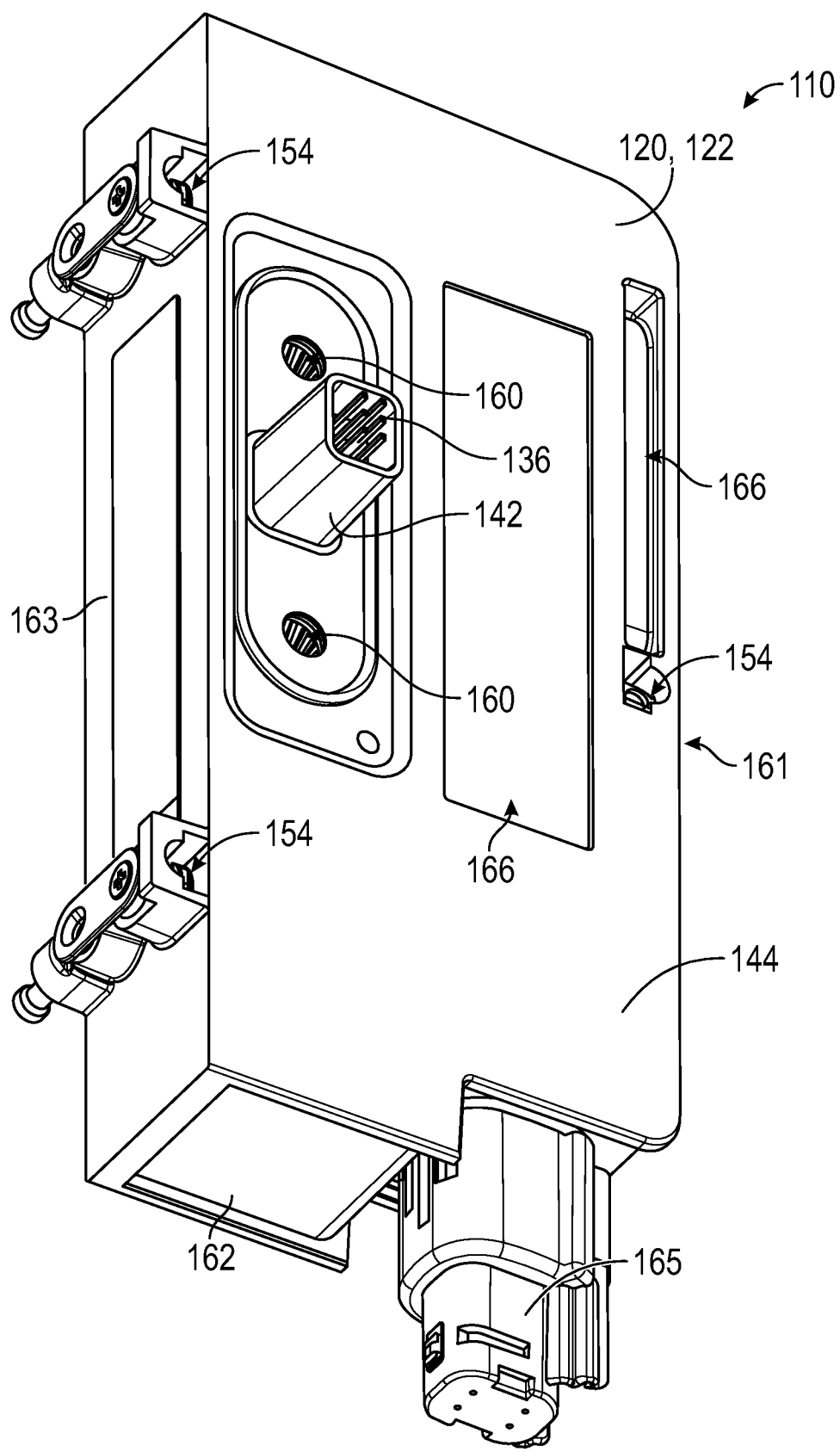
Figure 4:
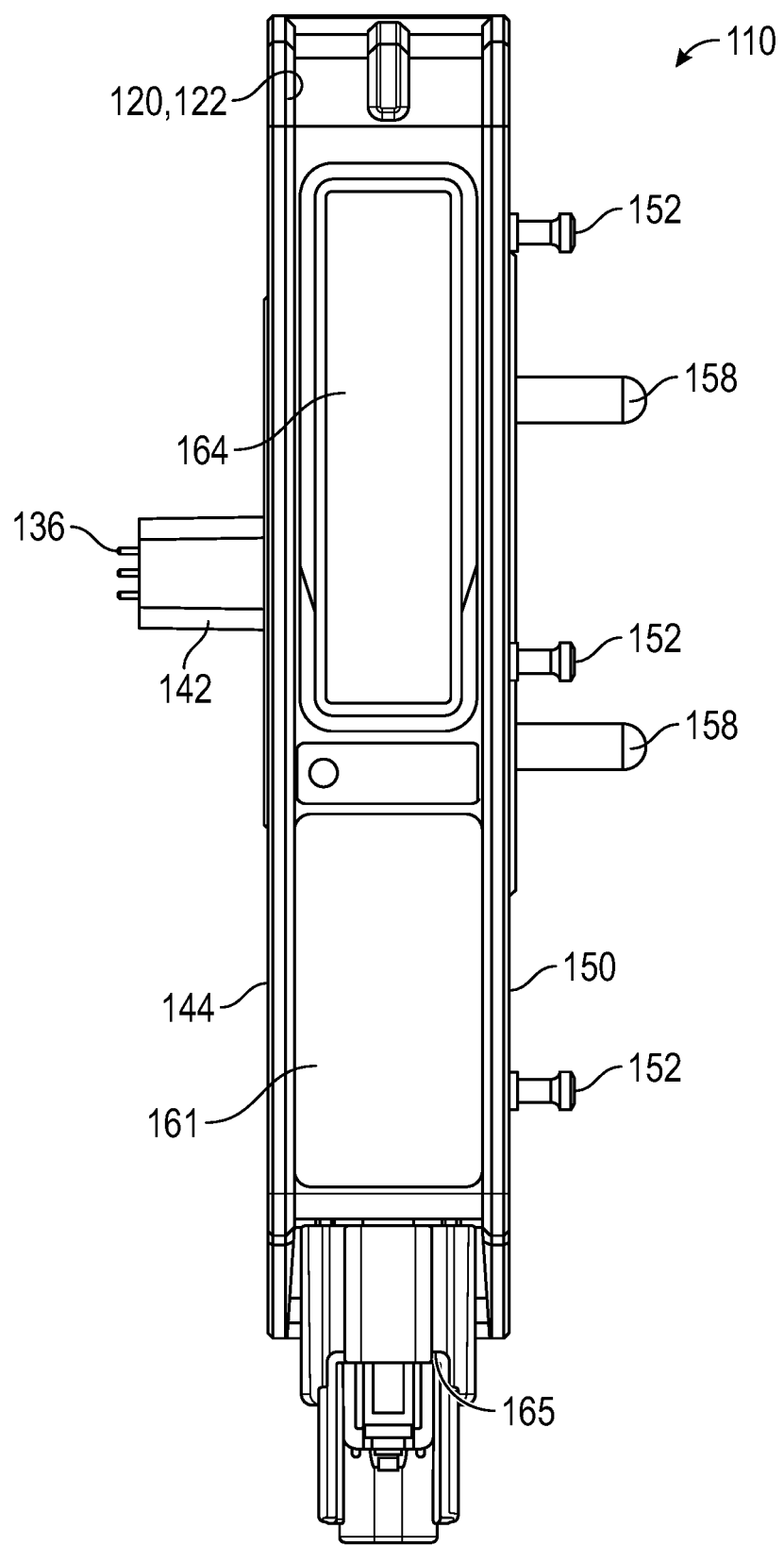
Figure 5:
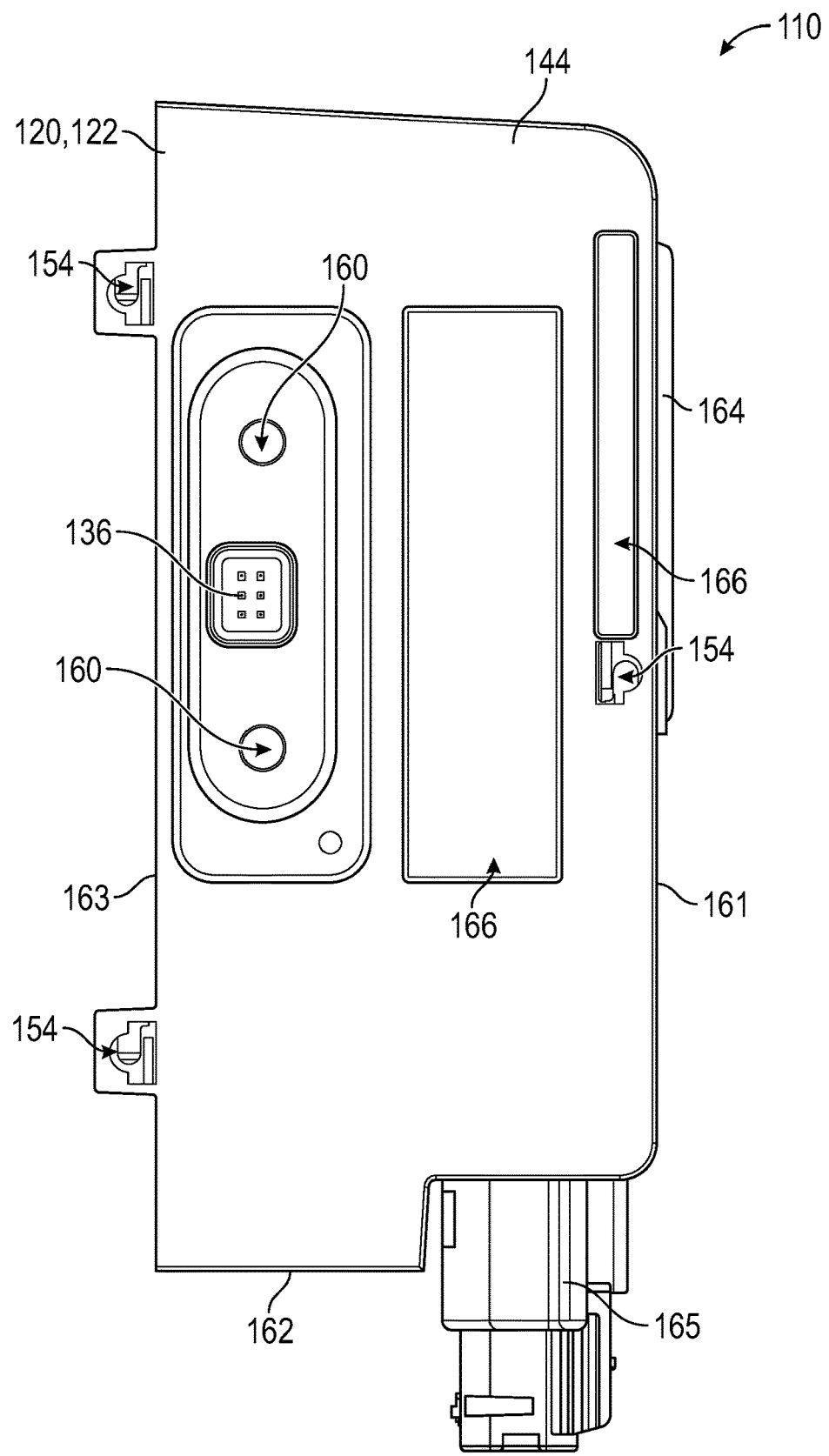
Figure 6:
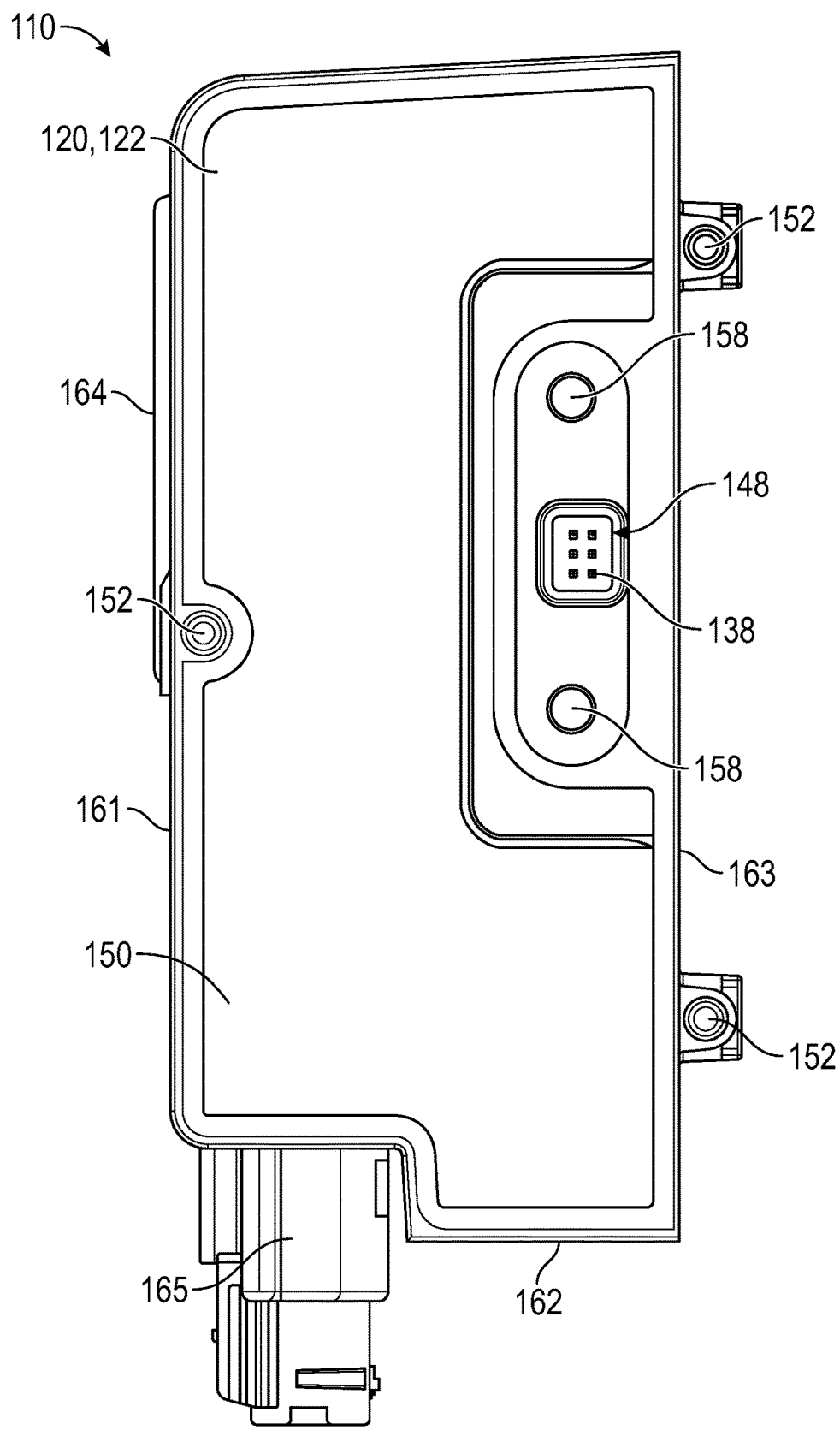
Figure 7:
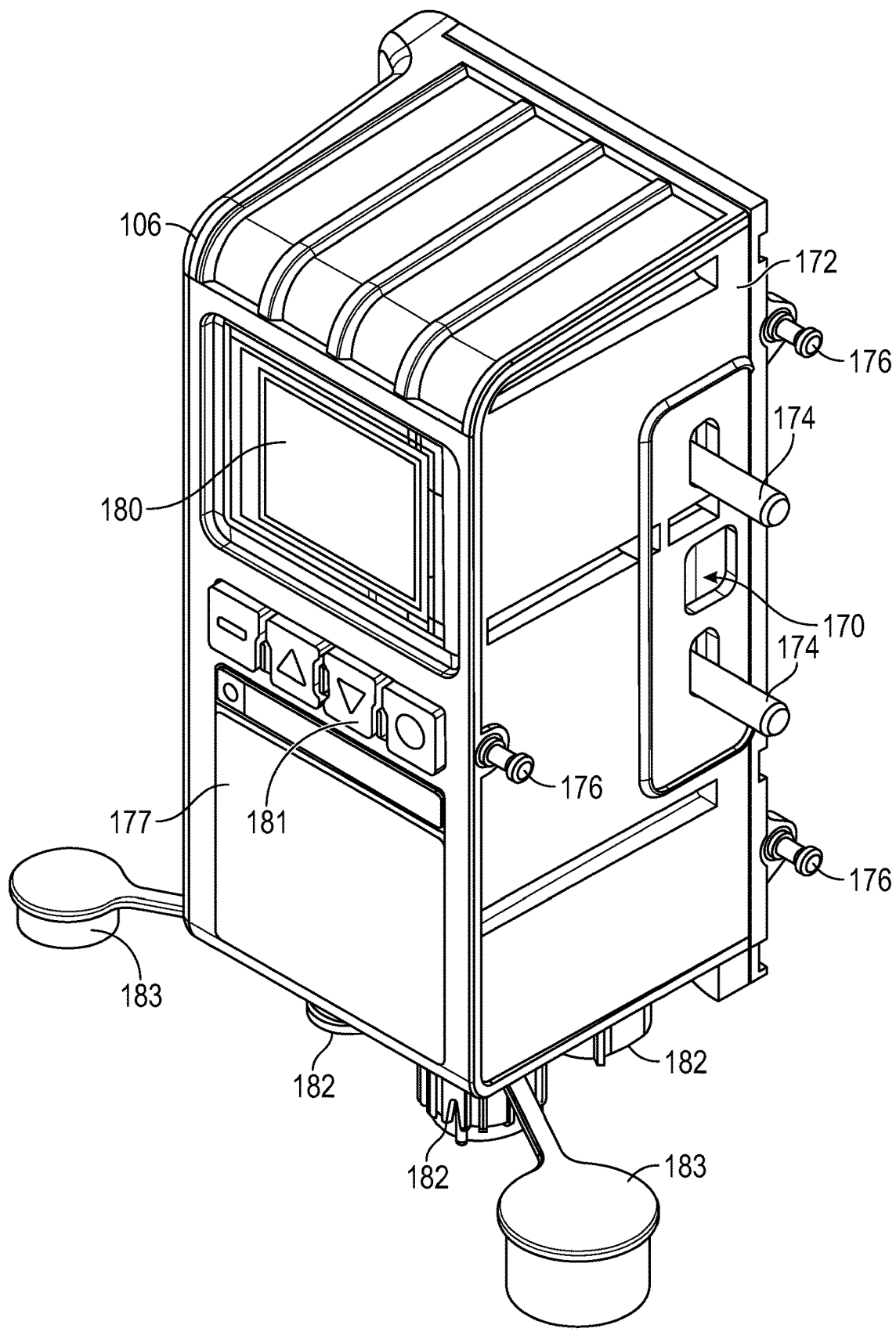
FIGS. 7-10 illustrate various views of a master controller of an electrical power distribution system in accordance with embodiments of the disclosure.

Load controller 110 may include other features. For example, as shown in FIG. 3, load controller 110 may include one or more surface recesses 166. The surface recesses 166 may provide one or more functional characteristics. For example, the surface recesses 166 may be configured to provide or increase cooling of load controller 110. In some embodiments, the surface recesses 166 may be configured to facilitate seating of load controller 110 against an adjacent controller (e.g., seating of load controller 110 against master controller 106, against power input controller 108, or against another load controller 110). In some embodiments, the surface recesses 166 may provide additional characteristics.

FIGS. 7-10 illustrate various views of master controller 106 in accordance with an embodiment of the disclosure. Master controller 106 may include many configurations providing for modular attachment or connection of master controller 106 to modular electrical power distribution system 100. For example, master controller 106 may include a third electrical connector 168 configured to interface with a succeeding controller, such as a load controller, of modular electrical power distribution system 100. For example, the third electrical connector 168 may interface with first load controller 120, such as with the first electrical connector 136 of first load controller 120. As shown, the third electrical connector 168 may include or be positioned within a third receptacle 170 disposed in a first side 172 of master controller 106. The third electrical connector 168 may be any suitable I/O connector, such as a multi-pin connector (e.g., a 6-pin connector, an 8-pin connector, etc.), for example. The third electrical connector 168 may be a female pin connector. Engagement of the third electrical connector 168 with the succeeding controller may at least partially define module detection signal line 130 and/or shared serial communication bus 128 with the succeeding controller.

With continued reference to FIGS. 7-10, master controller 106 may include a second pair of prongs 174 extending from the first side 172 of master controller 106, such as adjacent to the third electrical connector 168 in flanked alignment. In such embodiments, the second pair of prongs 174 may be configured to interface with the pair of prong receptacles 160 of a load controller 110, similar in function and shape to prongs 158. For example, the second pair of prongs 174 of master controller 106 may interface with the prong receptacles 160 of first load controller 120, such as the second pair of prongs 174 inserted at least partially within prong receptacles 160 of first load controller 120. The second pair of prongs 174 and the prong receptacles 160 of first load controller 120 may be aligned so that modular connection of master controller 106 with first load controller 120 aligns master controller 106 with first load controller 120, such as aligning master controller 106 side-by-side with first load controller 120. The modular connection may allow master controller 106 to be physically and electrically connected to other controllers of modular electrical power distribution system 100. For example, master controller 106 may be connected to second load controller 122 or other load controller of modular electrical power distribution system 100 in the same manner as first load controller 120.

In some embodiments, master controller 106 may include one or more bosses 176 extending from the first side 172 of master controller 106 to further align and/or secure master controller 106 to a load controller 110. For example, the bosses 176, which may be similar or identical to the bosses 152 described above, may be received and secured within the apertures 154 of first load controller 120 to align and secure master controller 106 to first load controller 120. In some embodiments, the bosses 176 may be secured within the apertures 152 via a mechanical fastener or other securement means, such as to prevent or limit disengagement of master controller 106 from first load controller 120.

Like load controller 110, master controller 106 may be a cuboid shaped module with a front face 177, a bottom face 178, and a rear face 179, among other faces, between the first side 172 and an opposing side of master controller 106. As shown, the front face 177 may be relatively wide compared to load controller 110. The bosses 176 may be positioned at or near the perimeter of the first side 172, such as one or more bosses 176 (e.g., two bosses 176) positioned at the perimeter of the first side 172 near the rear face 179 and one or more bosses 176 (e.g., a single boss 176) positioned at the perimeter of the first side 172 near the front face 177, similar to load controller 110, to interface with the apertures 154 disposed correspondingly in load controller 110. Similar to load controller 110, the structural connection features of master controller 106 may be closer to the perimeter of the first side 172, with the communication or electrical connection features of master controller 106 closer to the center of the first side 172.

The front face 177 of master controller 106 may include a display 180 and one or more control buttons 181. Display 180 may provide status or other information regarding master controller 106 and/or modular electrical power distribution system 100. For example, display 180 may render a connection status, a power status, a fault status, an error status, an operation status, and/or a mode status, among others, of master controller 106 and/or any other modules or controllers of modular electrical power distribution system 100. Control buttons 181 may receive user input for user programmable operation of master controller 106 and/or modular electrical power distribution system 100, such as, for example, monitoring and/or switching of or between loads, checking connection statuses or errors, initiating a detection process, or the like.

Figure 8:
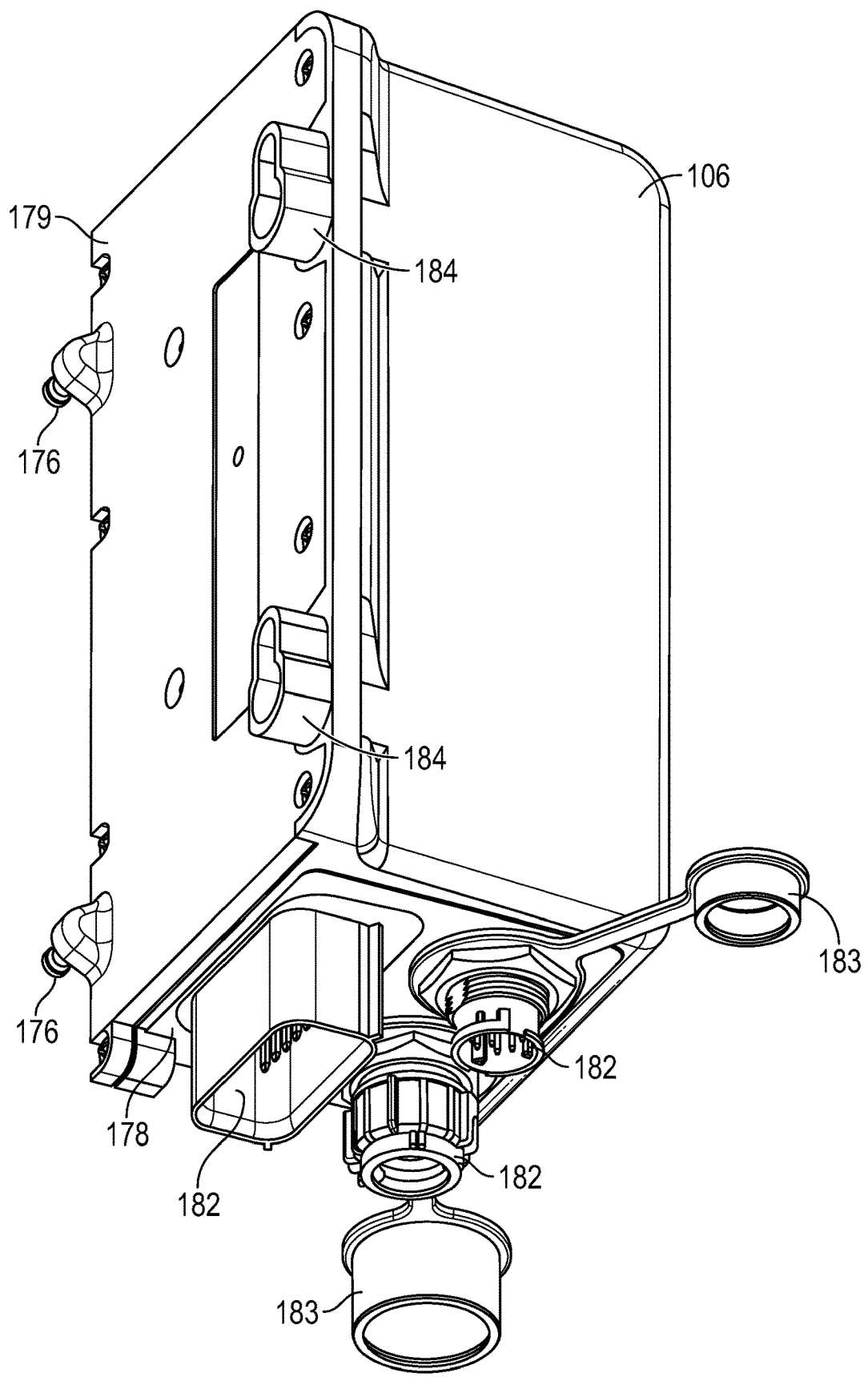
Figure 9:
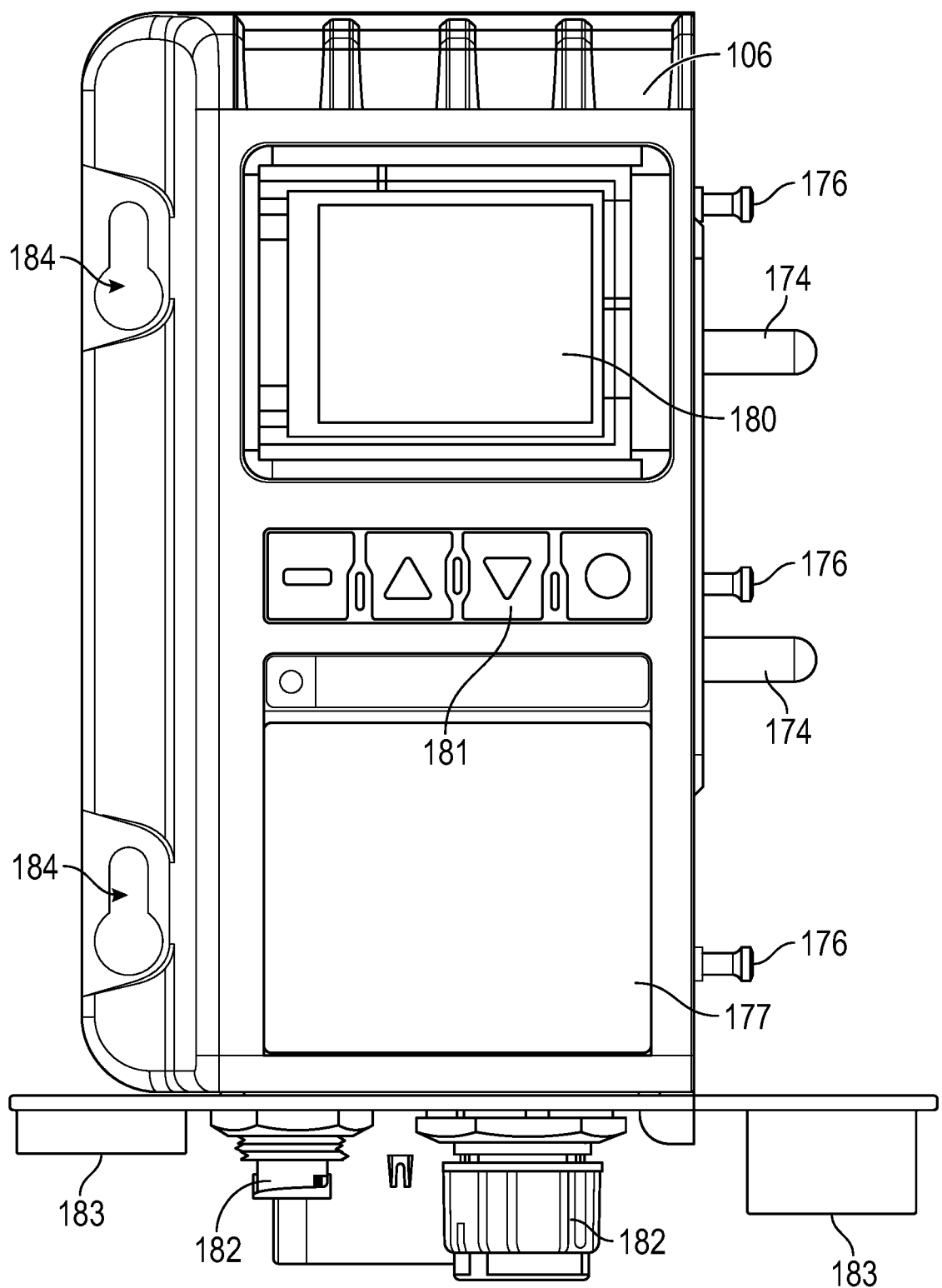
Figure 10:
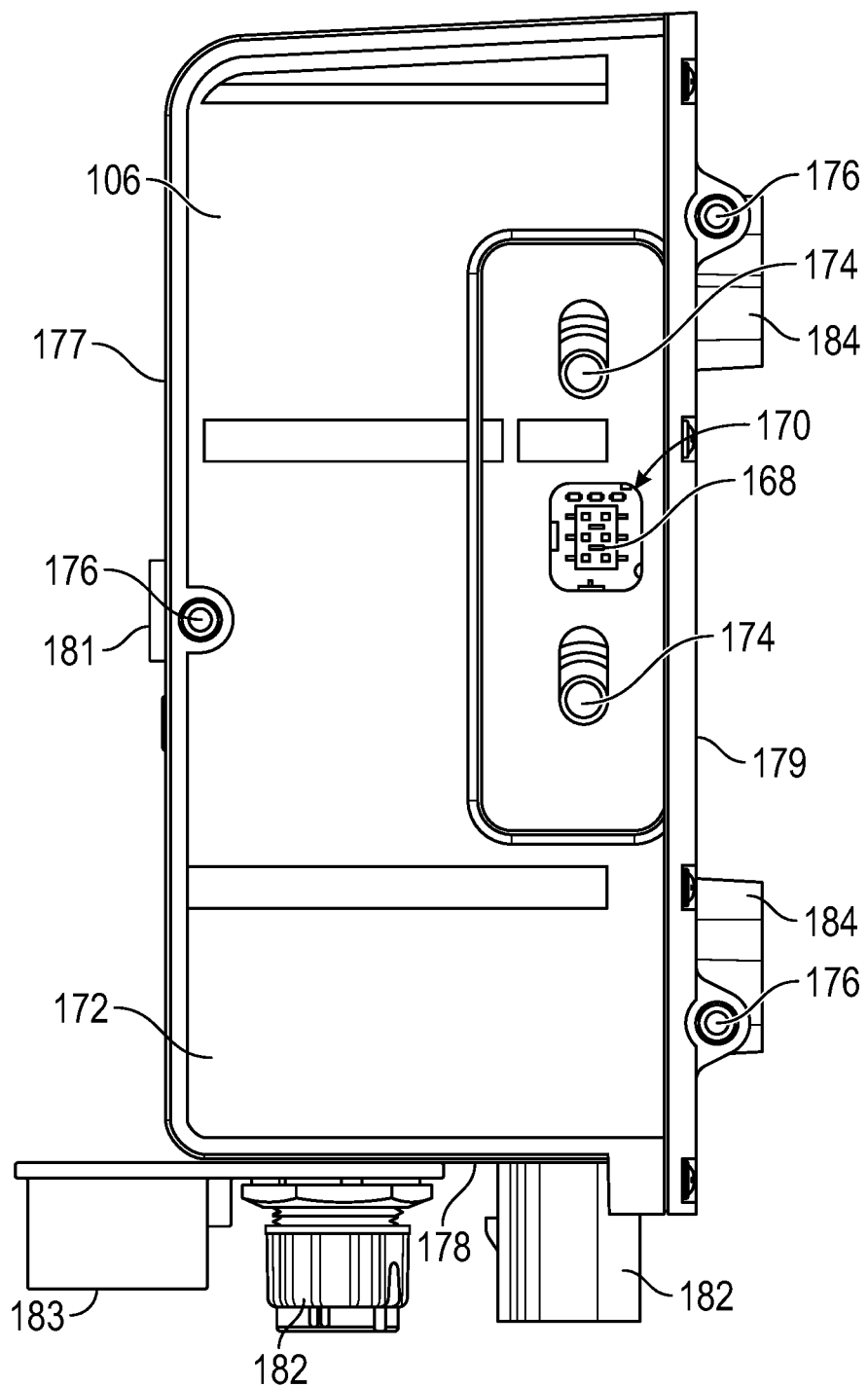
Figure 11:
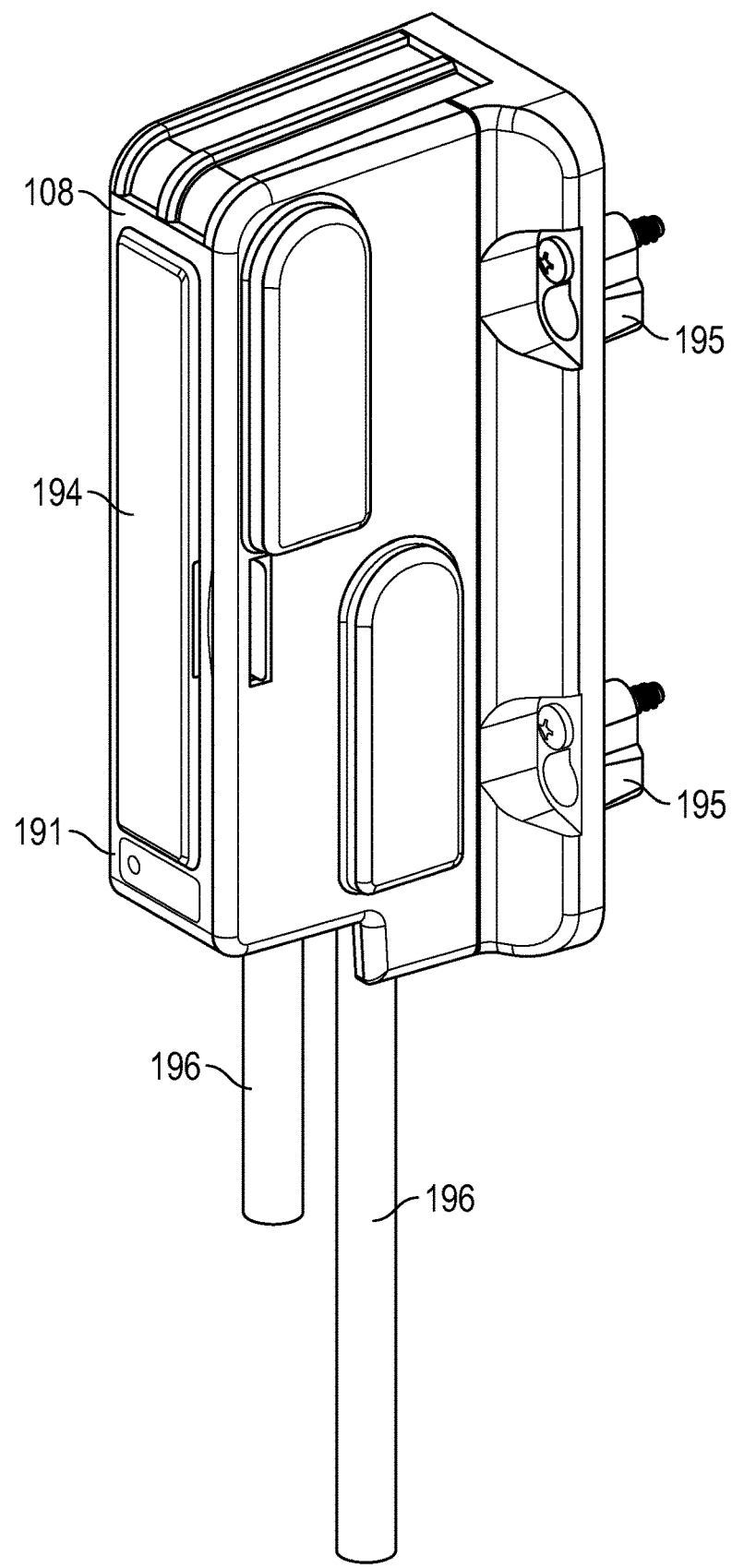
FIGS. 11-14 illustrate various views of a power input controller of an electrical power distribution system in accordance with embodiments of the disclosure.
Figure 12:
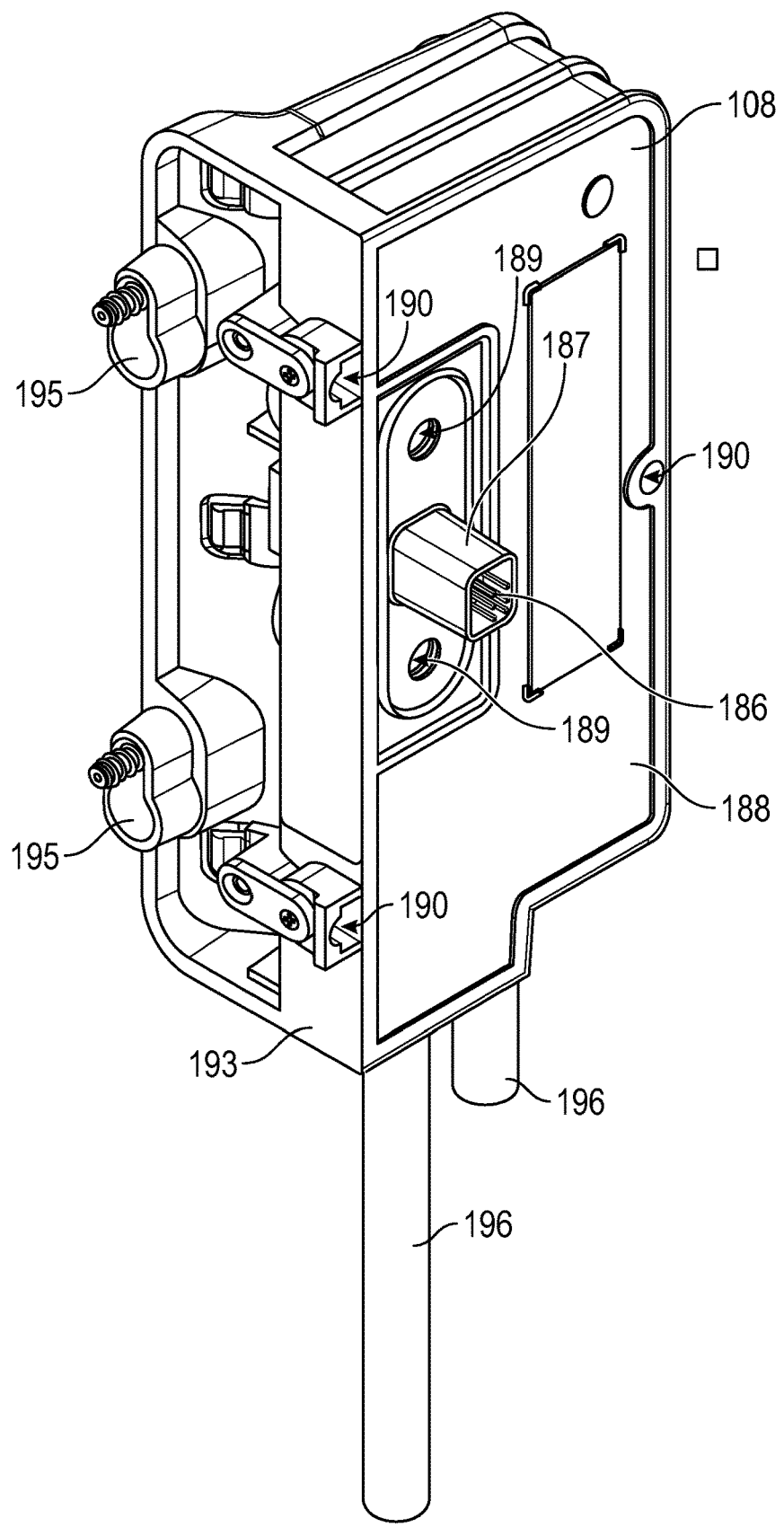
Figure 13:
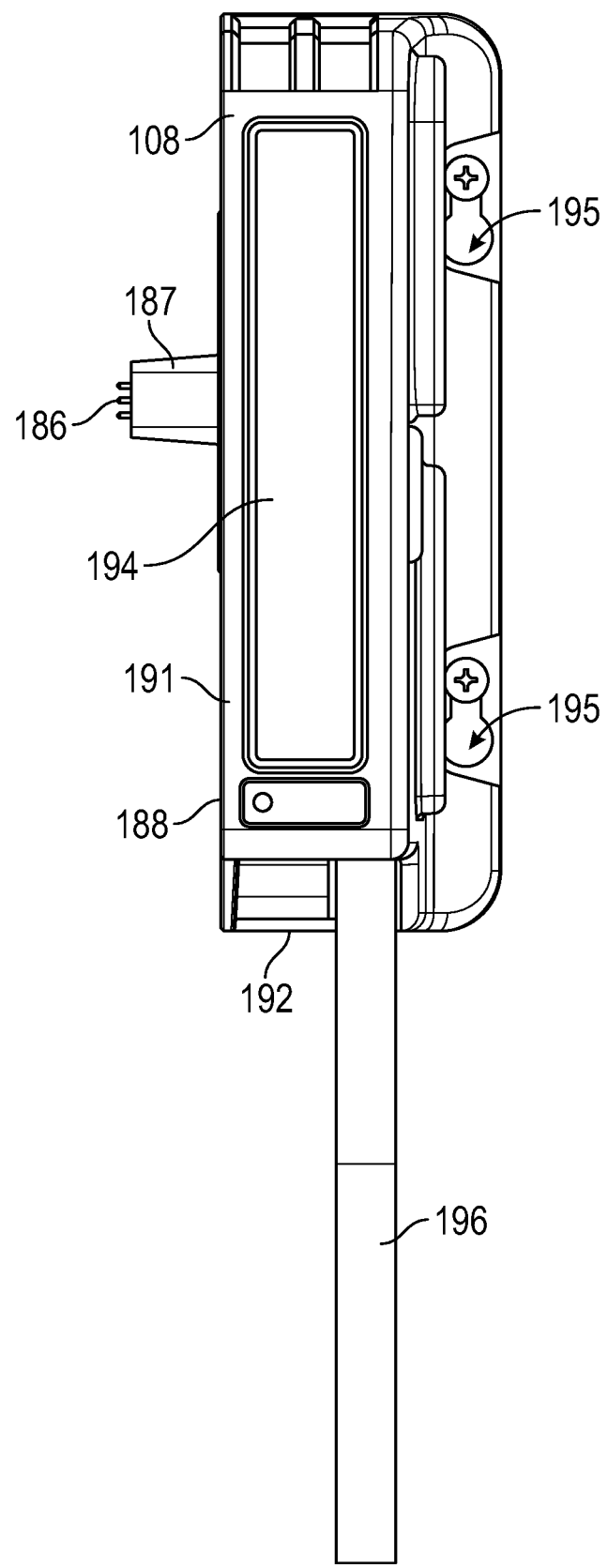
Figure 14:
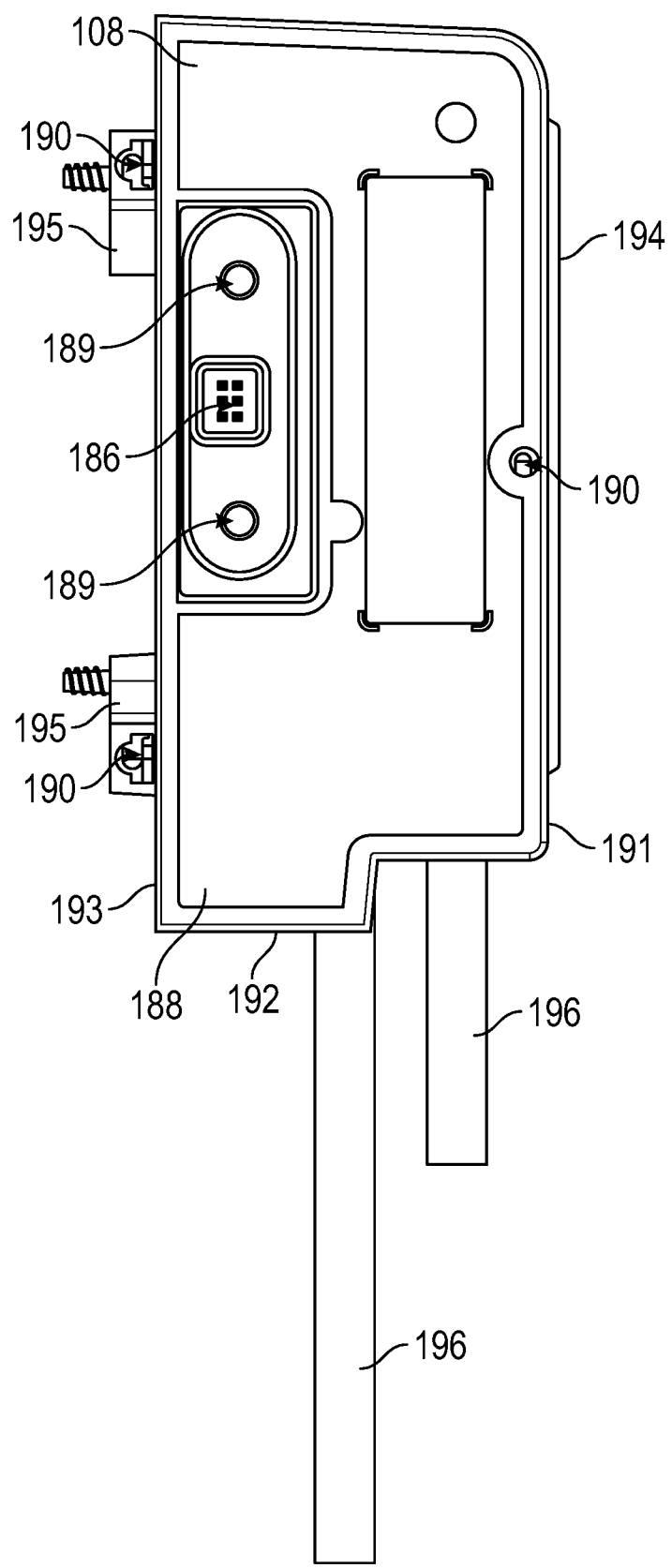

As best illustrated in FIG. 8, the bottom face 178 may include one or more connection adapters 182 for connection to a power source, a remote unit, a communications link, a controller, or the like. In some embodiments, each connection adapter 182 may include a cap 183 that protects the connection adapter 182 when not in use (e.g., during shipping, storage, etc.). In some embodiments, master controller 106 may be embodied as a remote unit that is controlled by another master controller 106. In such embodiments, one or more of the connection adapters 182 may be omitted from master controller 106. The rear face 179 may include one or more features facilitating installation of master controller 106. For instance, the rear face 179 may include one or more keyhole fasteners 184 that interface with one or more screws, bolts, or posts of the vehicle to secure master controller 106 in place.

FIGS. 11-14 illustrate various views of power input controller 108 in accordance with an embodiment of the disclosure. Power input controller 108 may include many configurations providing for modular attachment or connection of power input controller 108 to modular electrical power distribution system 100. For example, power input controller 108 may include a fourth electrical connector 186 configured to interface with a preceding controller, such as a load controller 110, of modular electrical power distribution system 100. For example, the fourth electrical connector 186 may interface with second load controller 122, such as with the second electrical connector 138 of second load controller 122. As shown, the fourth electrical connector 186 may include or be positioned on a post 187 extending from a first side 188 of power input controller 108. The fourth electrical connector 186 may be any suitable I/O connector, such as a multi-pin connector (e.g., a 6-pin connector, an 8-pin connector, etc.), for example. The fourth electrical connector 186 may be a male pin connector. Engagement of the fourth electrical connector 186 with the preceding controller may at least partially define module detection signal line 130 and/or shared serial communication bus 128 with the preceding controller.

With continued reference to FIGS. 11-14, power input controller 108 may include a pair of prong receptacles 189 defined in the first side 188 of power input controller 108, such as adjacent to the fourth electrical connector 186 in flanked alignment. In such embodiments, the pair of prong receptacles 189 may be configured to interface with the pair of prongs 158 of a load controller 110, similar in function and/or shape to prong receptacles 160. For example, the pair of prong receptacles 189 of power input controller 108 may interface with the prongs 158 of second load controller 122, such as the prongs 158 of second load controller 122 inserted at least partially within pair of prong receptacles 189 of power input controller 108. The pair of prong receptacles 189 and the prongs 158 of second load controller 122 may be aligned so that modular connection of power input controller 108 with second load controller 122 aligns power input controller 108 with second load controller 122, such as aligning power input controller 108 side-by-side with second load controller 122. The modular connection may allow power input controller 108 to be connected to other controllers of modular electrical power distribution system 100. For example, power input controller 108 may be connected to first load controller 120 or other load controller of modular electrical power distribution system 100 in the same manner as second load controller 122.

In some embodiments, power input controller 108 may include one or more apertures 190 defined in the first side 188 of power input controller 108 to further align and/or secure power input controller 108 to a load controller 110. For example, the apertures 190, which may be similar or identical to the apertures 154 described above, may at least partially receive the bosses 152 of second load controller 122 to align and secure power input controller 108 to second load controller 122. In some embodiments, the bosses 152 may be secured within the apertures 190 via a mechanical fastener or other securement means, such as to prevent or limit disengagement of power input controller 108 from second load controller 122.

Like load controller 110 and master controller 106, power input controller 108 may be a cuboid shaped module with a front face 191, a bottom face 192, and a rear face 193, among other faces, between the first side 188 and an opposing side of power input controller 108. The apertures 190 may be positioned at or near the perimeter of the first side 188, such as one or more apertures 190 (e.g., two apertures 190) positioned at the perimeter of the first side 188 near the rear face 193 and one or more apertures 190 (e.g., a single aperture 190) positioned at the perimeter of the first side 188 near the front face 191, similar to load controller 110, to interface with the bosses 152 positioned correspondingly on load controller 110. Similar to load controller 110 and master controller 106, the structural connection features of power input controller 108 may be closer to the perimeter of the first side 188, with the communication or electrical connection features of power input controller 108 closer to the center of the first side 188.

The front face 191 may include a display 194 to provide status or other information regarding power input controller 108. For example, the display 194 may render a connection status, a power status, a fault status, an error status, an operation status, a mode status, and/or other indications of power input controller 108. Like master controller 106, the rear face 193 of power input controller 108 may include one or more keyhole fasteners 195 that interface with one or more screws, bolts, or posts of the vehicle to secure power input controller 108 in place. One or more power wires 196 may be connected to the bottom face 192 to provide electrical power to power input controller 108.

As described, modular electrical power distribution system 100 includes one master controller 106, one power input controller 108, and a variable number of interchangeable load controllers 110 between master controller 106 and power input controller 108. For modular electrical power distribution system 100 to function properly, master controller 106 may need to know one or more characteristics of load controllers 110 connected between master controller 106 and power input controller 108. For example, master controller 106 may need to know the type of load controllers 110, the positions of each load controller 110 in the stack, and the total number load controllers 110 in the stack for master controller 106 to effectively control power distribution to the various load controllers 110. As described more fully below, module detection signal line 130 and shared serial communication bus 128 may be utilized to gather such characteristics and information. For example, each controller (e.g., each load controller 110) may receive an input detection signal from a preceding controller and feed an output detection signal to the next controller in turn to determine one or more characteristics of modular electrical power distribution system 100.

With reference to FIG. 1, master controller 106 may initiate a detection process (e.g., when requested or by remote command) by asserting a module detection signal to first load controller 120. Assertion of the module detection signal by master controller 106 may signify to first load controller 120 that the detection process is in session and first load controller 120 may communicate with master controller 106 to provide relevant information, such as via shared serial communication bus 128. Once an exchange of information between first load controller 120 and master controller 106 is complete, first load controller 120 may assert an output detection signal to second load controller 122. In some embodiments, the detection process may cause first load controller 120 to enter a passive mode awaiting a command that signifies the entire detection process is complete and normal operation can be resumed.

Assertion of the output detection signal by first load controller 120 may signify to second load controller 122 that the detection process is in session and second load controller 122 may communicate with master controller 106 to provide relevant information, such as via shared serial communication bus 128. Once an exchange of information between second load controller 122 and master controller 106 is complete, second load controller 122 may assert an output detection signal to power input controller 108. In some embodiments, the detection process may cause second load controller 122 to enter a passive mode awaiting a command that signifies the entire detection process is complete and normal operation can be resumed.

Assertion of the output detection signal by second load controller 122 may signify to power input controller 108 that the detection process is in session and power input controller 108 may communicate with master controller 106 to provide relevant information, such as via shared serial communication bus 128. Exchange of information between power input controller 108 and master controller 106 may signify the end of the detection process, whereupon modular electrical power distribution system 100 may revert to normal operation.

In general operation, once all load controllers are detected, master controller 106, load controllers 110, and/or power input controller 108 may be configured to monitor and/or control operation of modular electrical power distribution system 100, such as according to parameters provided to master controller 106 via a user interface integrated with master controller 106 and/or an external display or device (e.g., a multifunction display, a smart phone, a personal computing device) communicatively coupled (e.g., over a wired and/or wireless communication channel) to master controller 106. For example, master controller 106 may be configured to accumulate power monitoring characteristics of any one or combination of load controllers 110 and/or power input controller 108 over time and provide a time series of such power monitoring characteristics (e.g., voltage level, current draw, power delivery, noise level, frequency, deviation percentages from expected characteristics, and/or other power monitoring characteristics described herein) for display and/or storage by an external display or device. In another example, master controller 106 may be configured to receive power monitoring and/or control parameters from a user interface integrated with master controller 106 and/or an external display or device (e.g., via user input provided to the user interface), such as trip current levels for programmable load fusing, current and/or power draw alert levels, and/or other power monitoring and/or control parameters described herein, and to control one or more of load controllers 110 according to the received power monitoring and/or control parameters, for example, and/or to generate and provide power monitoring and/or system status alerts for display to a user via the user interface.

In some embodiments, master controller 106 may be configured to receive an operating mode status from a user interface and/or a control system of a watercraft (e.g., to which system 100 is mounted) corresponding to a limited power operating mode of the watercraft, such as a power conservation mode or an extended electrical propulsion mode, for example, and to switch off a predetermined set of relatively low priority electrical loads by switching off corresponding set of load controllers 110 of modular electrical power distribution system 100. In related embodiments, master controller 106 may be configured to detect a power or voltage sag in power provided by power system 112 (e.g., by monitoring power delivery characteristics of power system 112 provided by power input controller 108) and to switch off a predetermined set of relatively low priority electrical loads by switching off corresponding set of load controllers 110 of modular electrical power distribution system 100. Such set of relatively low priority electrical loads and/or their corresponding load controllers may be included in power monitoring and/or control parameters provided by user input to a user interface associated with modular electrical power distribution system 100, as described herein. In various embodiments, master controller 106 may be configured to switch such load controllers back on after detecting such power or voltage sag is no longer present in the power delivered by power system 110, for example, or after receiving an updated operating mode status indicating exit of a limited power operating mode of the watercraft.

In still further embodiments, master controller 106 may be configured to switch on or off a predetermined electrical load or set of electrical loads based, at least in part, on a time of day, a geographical location (e.g., provided by a position sensor of a navigation system of the watercraft), an ambient temperature (e.g., provided by a temperature sensor of a navigation or control system of the watercraft and/or integrated with modular electrical power distribution system 100), a bilge water level, a heave or roll amplitude and/or frequency, and/or other environmental conditions, as provided in a set of power monitoring and/or control parameters provided to modular electrical power distribution system 100. Corresponding environmental state sensors may be communicatively coupled directly to modular electrical power distribution system 100, for example, or may be coupled through one or more subsystems of a watercraft and/or a common communication bus for the watercraft, as described herein.

Modular electrical power distribution system 100 may be implemented on a variety of mobile structures (e.g., a watercraft, aircraft, motor vehicle, and/or other mobile structure). For example, modular electrical power distribution system 100 may be implemented on a marine vessel or ship. In some embodiments, modular electrical power distribution system 100 may be implemented on the mobile structure described in U.S. patent application Ser. No. 16/533,620, filed Aug. 6, 2019 and entitled "VIDEO SENSOR FUSION AND MODEL BASED VIRTUAL AND AUGMENTED REALITY SYSTEMS AND METHODS," which is incorporated herein by reference. In such embodiments, at least one controller of modular electrical power distribution system 100 (e.g., master controller 106) may communicate with a logic device and/or user interface of the mobile structure, such as controller 111 and user interface 112 of U.S. patent application Ser. No. 16/533,620, for various purposes.

Figure 15:
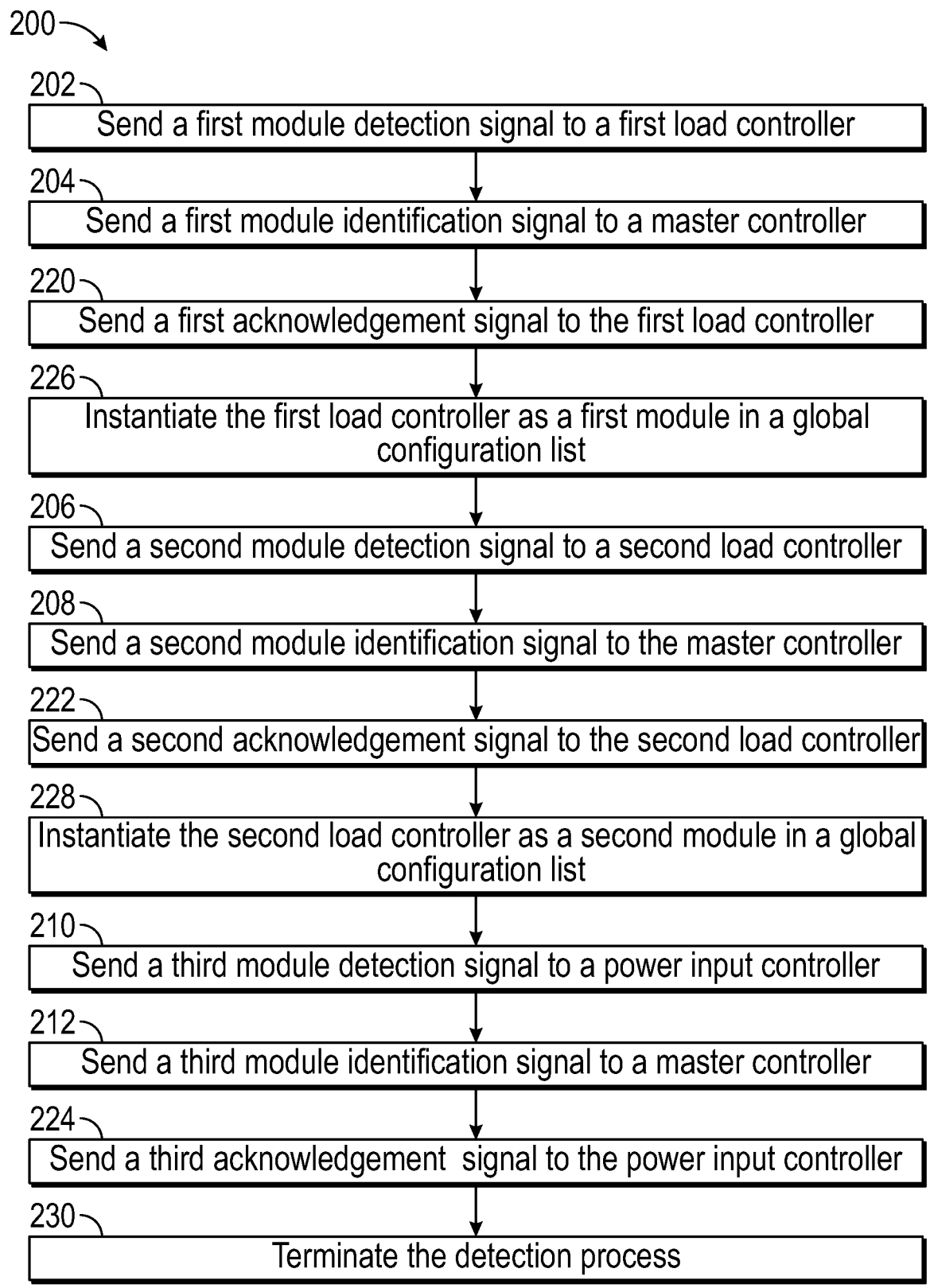
FIG. 15 illustrates a flow diagram of a process for detecting one or more characteristics of a modular electrical power distribution system in accordance with an embodiment of the disclosure.

FIG. 15 illustrates a flow diagram of a process 200 of detecting one or more characteristics of a modular electrical power distribution system in accordance with an embodiment of the disclosure. The operations of process 200 may be implemented as software instructions executed by one or more logic devices associated with corresponding electronic devices, sensors, and/or structures depicted in FIGS. 1-14. More generally, the operations of process 200 may be implemented with any combination of software instructions and/or electronic hardware (e.g., inductors, capacitors, amplifiers, actuators, or other analog and/or digital components).

It should be appreciated that any step, sub-step, sub-process, or block of process 200 may be performed in an order or arrangement different from the embodiments illustrated in FIG. 15. For example, one or more blocks may be omitted from or added to process 200. Furthermore, block inputs, block outputs, various sensor signals, sensor information, and/or other operational parameters may be stored to one or more memories prior to moving to a following portion of a corresponding process. Although process 200 is described with reference to power distribution system 100 and FIGS. 1-14, process 200 may be performed by other systems different from those systems and including a different selection of electronic devices, sensors, assemblies, mobile structures, and/or mobile structure attributes.

Referring to FIG. 15, the modular electrical power distribution system may be similar to power distribution system 100 described above. For example, the modular power distribution system may include a plurality of controllers in communication with one another via a shared serial communication bus and a module detection signal line. In block 202, process 200 includes sending a first module detection signal to a first load controller of the plurality of controllers. For example, a master controller of the plurality of controllers may assert the first module detection signal to the first load controller via the module detection signal line. In block 204, process 200 includes sending a first module identification signal to a master controller. For instance, the first load controller may send the first module identification signal to the master controller via the shared serial communication bus. In some embodiments, the first module identification signal may be sent by the first load controller in response to the first load controller receiving the first module detection signal. The first module identification signal may include information regarding one or more characteristics of the first load controller. For example, the first module identification signal may include information regarding the type of the first load controller, one or more ratings of the first load controller, a status of the first load controller, or other information about the first load controller.

In block 206, process 200 includes sending a second module detection signal to a second load controller of the plurality of controllers. For example, the first load controller may assert the second module detection signal to the second load controller via the module detection signal line. In block 208, process 200 includes sending a second module identification signal to the master controller. For instance, the second load controller may send the second module identification signal to the master controller via the shared serial communication bus. In some embodiments, the second module identification signal may be sent by the second load controller in response to the second load controller receiving the second module detection signal. The second module identification signal may include information regarding one or more characteristics of the second load controller. For example, the second module identification signal may include information regarding the type of the second load controller, one or more ratings of the second load controller, a status of the second load controller, or other information about the second load controller.

In block 210, process 200 includes sending a third module detection signal to a power input controller of the plurality of controllers. For example, the second load controller may assert the third module detection signal to the power input controller via the module detection signal line. In block 212, process 200 includes sending a third module identification signal to the master controller. For example, the power input controller may send the third module identification signal to the master controller via the shared serial communication bus. In some embodiments, the third module identification signal may be sent by the power input controller in response to the power input controller receiving the third module detection signal. The third module identification signal may include information regarding one or more characteristics of the power input controller. For example, the third module identification signal may include information regarding the type of the power input controller, one or more ratings of the power input controller, a status of the power input controller, or other information about the power input controller.

In some embodiments, process 200 may include other features. For example, in block 220, process 200 may include sending a first acknowledgement signal to the first load controller, such as from the master controller in response to the master controller receiving the first module identification signal. In block 222, process 200 may include sending a second acknowledgement signal to the second load controller, such as from the master controller in response to the master controller receiving the second module identification signal. In block 224, process 200 may include sending a third acknowledgement signal to the power input controller, such as from the master controller in response to the master controller receiving the third module identification signal. The first, second, and third acknowledgement signals may confirm receipt of the first, second, and third module identification signals, respectively. In some embodiments, the first, second, and third acknowledgement signals may cause the first load controller, the second load controller, and/or the power input controller, or any combination thereof, to enter a passive mode awaiting a command that signifies the entire detection process 200 is complete and that normal operation can be resumed.

In block 226, process 200 may include instantiating or setting the first load controller as a first module in a global configuration list, such as in response to the master controller receiving the first module identification signal. In block 228, process 200 may include instantiating or setting the second load controller as a second module in the global configuration list, such as in response to the master controller receiving the second module identification signal. As described herein, instantiating the first load controller or the second load controller, among others, is to create a unique instance of the controller in a database, template, or computer object, among others. As a result, the master controller may determine the total number of modules/controllers in the modular electrical power distribution system and the position of each controller in the modular electrical power distribution system. In block 230, process 200 may include terminating the detection process, such as in response to the master controller receiving the third module identification signal from the power input controller. Terminating the detection process in block 230 may signify that the entire detection process is complete, and that normal operation of the controllers can be resumed.

Figure 16:
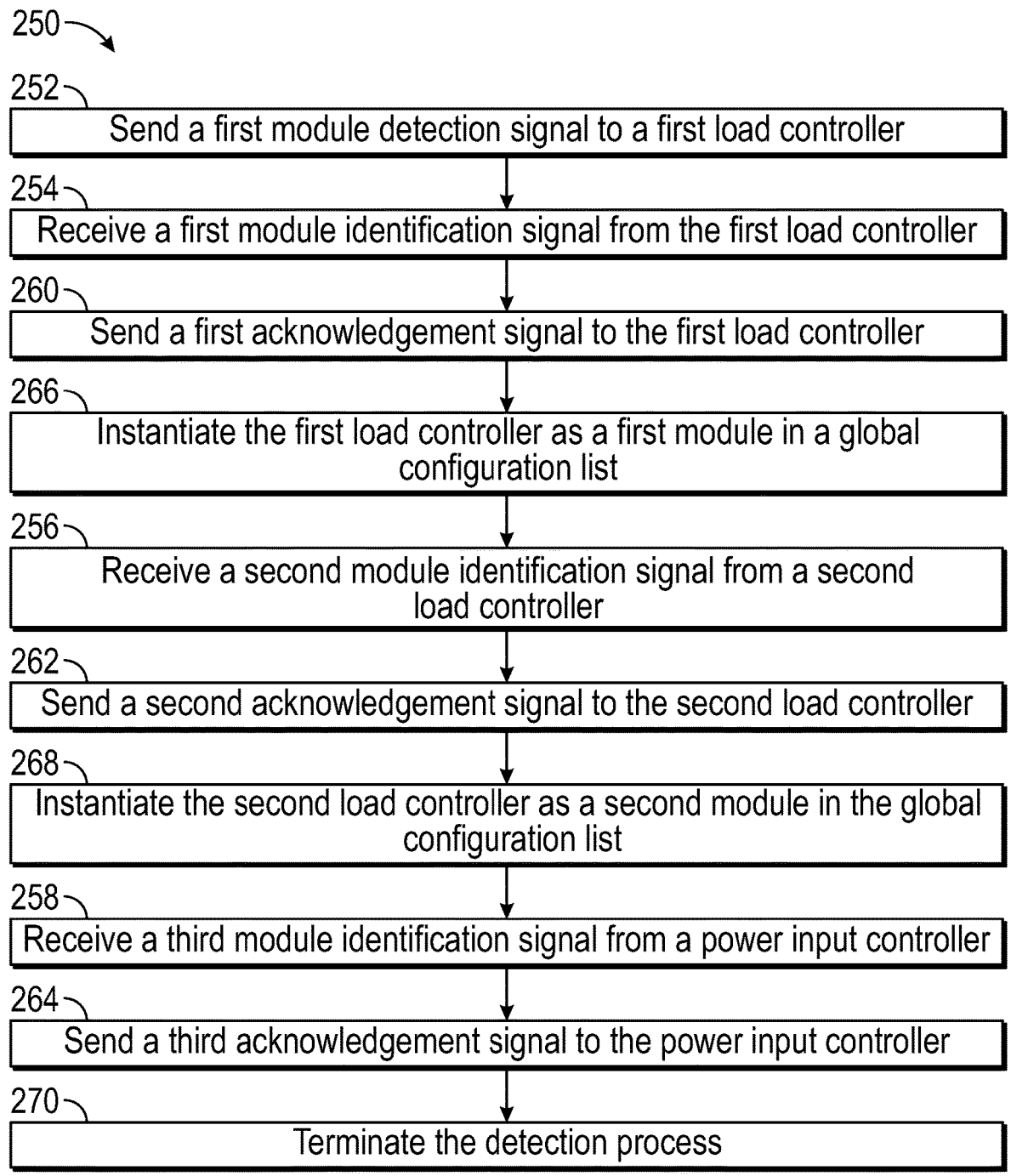
FIG. 16 illustrates a flow diagram of a process for detecting one or more characteristics of a modular electrical power distribution system in accordance with an embodiment of the disclosure.

FIG. 16 illustrates a flow diagram of a process 250 of detecting one or more characteristics of a modular electrical power distribution system in accordance with an embodiment of the disclosure. The operations of process 250 may be implemented as software instructions executed by one or more logic devices associated with corresponding electronic devices, sensors, and/or structures depicted in FIGS. 1-14. More generally, the operations of process 250 may be implemented with any combination of software instructions and/or electronic hardware (e.g., inductors, capacitors, amplifiers, actuators, or other analog and/or digital components).

It should be appreciated that any step, sub-step, sub-process, or block of process 250 may be performed in an order or arrangement different from the embodiments illustrated in FIG. 16. For example, one or more blocks may be omitted from or added to process 250 such as any of blocks illustrated and described with reference to FIG. 15. Furthermore, block inputs, block outputs, various sensor signals, sensor information, and/or other operational parameters may be stored to one or more memories prior to moving to a following portion of a corresponding process. Although process 250 is described with reference to power distribution system 100 and FIGS. 1-14, process 250 may be performed by other systems different from those systems and including a different selection of electronic devices, sensors, assemblies, mobile structures, and/or mobile structure attributes.

Referring to FIG. 16, the modular electrical power distribution system may be similar to power distribution system 100 described above. For example, the modular power distribution system may include a plurality of controllers in communication with one another via a shared serial communication bus and a module detection signal line. In block 252, process 250 includes sending a first module detection signal to a first load controller of the plurality of controllers. For example, a master controller of the plurality of controllers may assert the first module detection signal to the first load controller via the module detection signal line. In block 254, process 200 includes receiving a first module identification signal from the first load controller. For instance, the first module identification signal may be received by the master controller via the shared serial communication bus. The first module identification signal may include information regarding one or more characteristics of the first load controller. For example, the first module identification signal may include information regarding the type of the first load controller, one or more ratings of the first load controller, a status of the first load controller, or other information about the first load controller.

In block 256, process 250 includes receiving a second module identification signal from a second load controller of the plurality of controllers. For instance, the second module identification signal may be received by the master controller via the shared serial communication bus. The second module identification signal may include information regarding one or more characteristics of the second load controller. For example, the second module identification signal may include information regarding the type of the second load controller, one or more ratings of the second load controller, a status of the second load controller, or other information about the second load controller.

In block 258, process 250 includes receiving a third module identification signal from a power input controller of the plurality of controllers. For instance, the third module identification signal may be received by the master controller via the shared serial communication bus. The third module identification signal may include information regarding one or more characteristics of the power input controller. For example, the third module identification signal may include information regarding the type of the power input controller, one or more ratings of the power input controller, a status of the power input controller, or other information about the power input controller.

In block 260, process 250 may include sending a first acknowledgement signal to the first load controller. In block 262, process 250 may include sending a second acknowledgement signal to the second load controller. In block 264, process 250 may include sending a third acknowledgement signal to the power input controller. The first, second, and third acknowledgement signals may confirm receipt of the first, second, and third module identification signals, respectively. In block 266, process 250 may include instantiating the first load controller as a first module in a global configuration list. In block 268, process 250 may include instantiating the second load controller as a second module in the global configuration list. In block 270, process 250 may include terminating the detection process, signifying that the entire detection process is complete and that normal operation of the controllers can be resumed.

Figure 17:
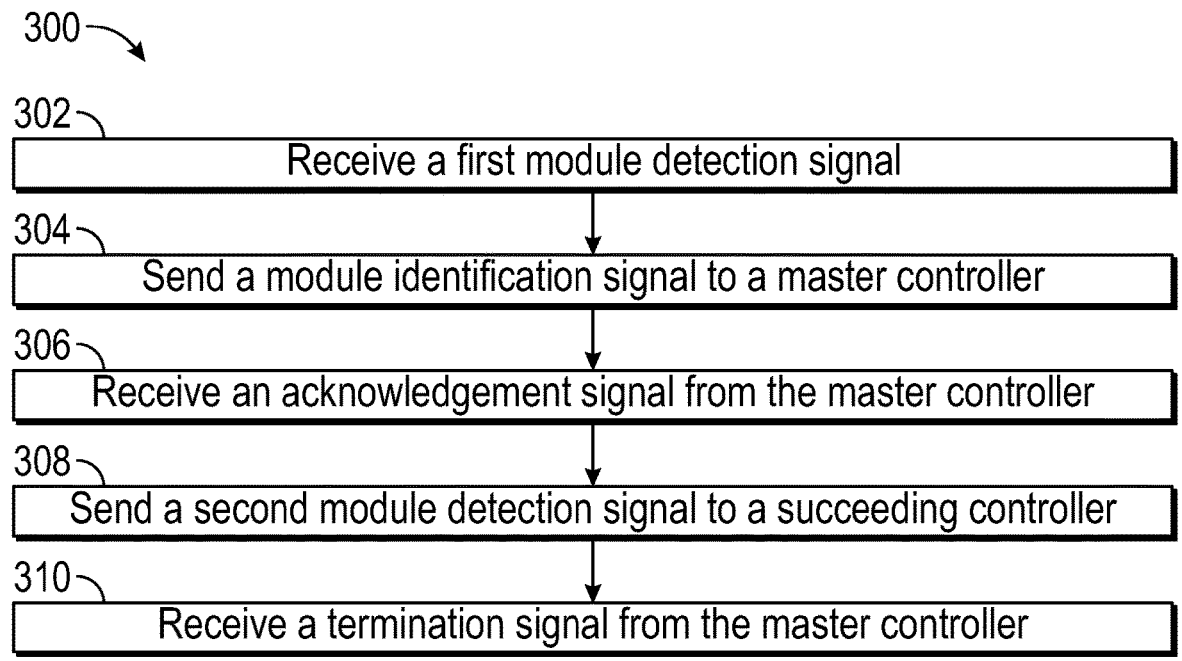
FIG. 17 illustrates a flow diagram of a process for detecting one or more characteristics of a modular electrical power distribution system in accordance with an embodiment of the disclosure.

FIG. 17 illustrates a flow diagram of a process 300 of detecting one or more characteristics of a modular electrical power distribution system in accordance with an embodiment of the disclosure. The operations of process 300 may be implemented as software instructions executed by one or more logic devices associated with corresponding electronic devices, sensors, and/or structures depicted in FIGS. 1-14. More generally, the operations of process 300 may be implemented with any combination of software instructions and/or electronic hardware (e.g., inductors, capacitors, amplifiers, actuators, or other analog and/or digital components).

It should be appreciated that any step, sub-step, sub-process, or block of process 300 may be performed in an order or arrangement different from the embodiments illustrated in FIG. 17. For example, one or more blocks may be omitted from or added to process 300, such as any of blocks illustrated and described with reference to FIGS. 15 and 16. Furthermore, block inputs, block outputs, various sensor signals, sensor information, and/or other operational parameters may be stored to one or more memories prior to moving to a following portion of a corresponding process. Although process 300 is described with reference to power distribution system 100 and FIGS. 1-14, process 300 may be performed by other systems different from those systems and including a different selection of electronic devices, sensors, assemblies, mobile structures, and/or mobile structure attributes.

Referring to FIG. 17, the modular electrical power distribution system may be similar to power distribution system 100 described above. For example, the modular power distribution system may include a plurality of controllers in communication with one another via a shared serial communication bus and a module detection signal line. In block 302, process 300 includes receiving a first module detection signal. For example, a load controller of the plurality of controllers may receive the first module detection signal from a preceding controller along the shared serial communication bus. The preceding controller may be a master controller or another load controller of the modular electrical power distribution system. In such embodiments, the preceding controller may assert the first module detection signal to the load controller. The first module detection signal may be received by the load controller via the module detection signal line.

In block 304, process 300 includes sending a module identification signal to the master controller. For instance, the load controller may send the module identification signal to the master controller, such as via the shared serial communication bus. The module identification signal may include information regarding one or more characteristics of the load controller. For example, the module identification signal may include information regarding the type of the load controller, one or more ratings of the load controller, a status of the load controller, or other information about the load controller.

In block 306, process 300 may include receiving an acknowledgement signal from the master controller. As one example, the load controller may receive the acknowledgement signal from the master controller. The acknowledgement signal may confirm receipt of the first module detection signal from the load controller.

In block 308, process 300 includes sending a second module detection signal to a succeeding controller along the shared serial communication bus. For example, the load controller may assert the second module detection signal to the succeeding controller. The succeeding controller may be another load controller or a power input controller of the modular electrical power distribution system. The second module detection signal may be sent by the load controller via the module detection signal line.

In block 310, process 300 may include receiving a termination signal from the master controller. For instance, the load controller may receive the termination signal from the master controller. Receipt of the termination signal from the master controller may signify that the detection process is complete and that normal operation can be resumed.

Figure 18:
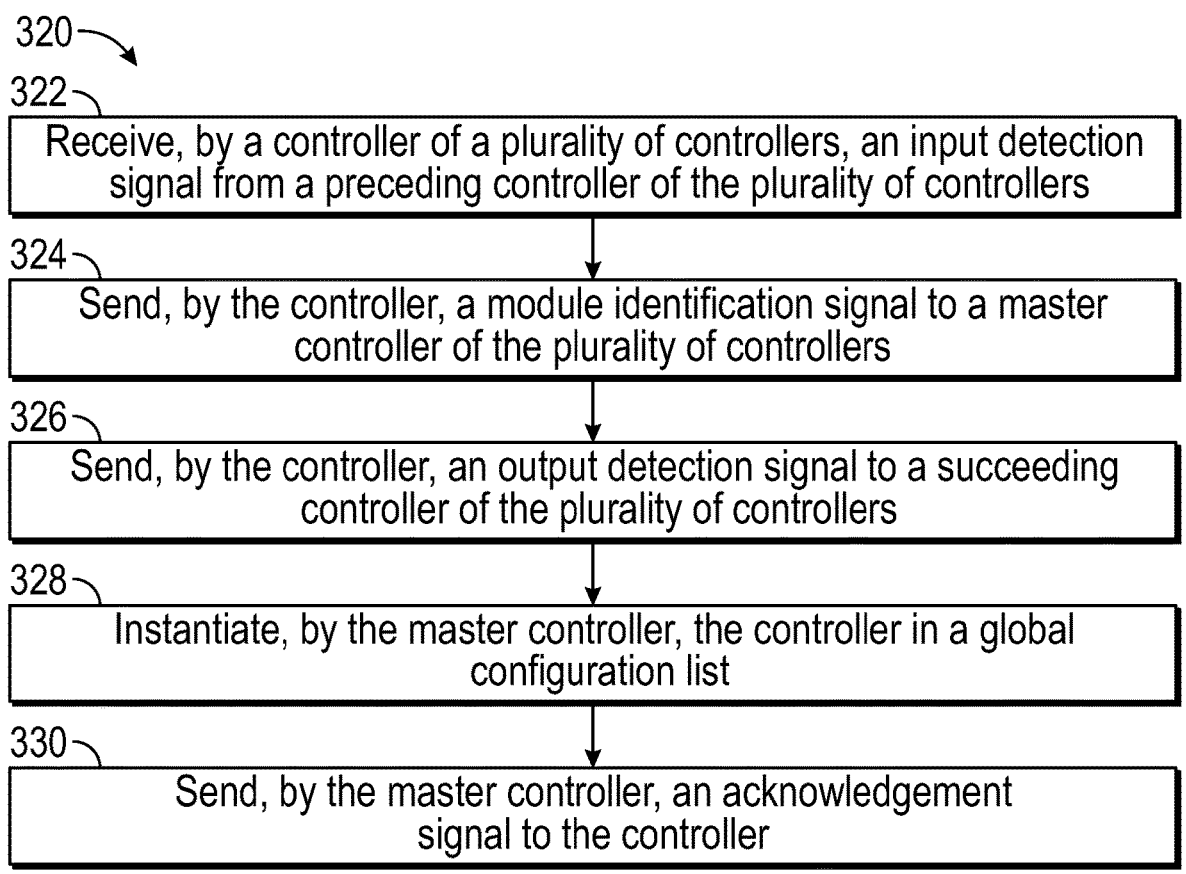
FIG. 18 illustrates a flow diagram of a process for detecting one or more modules of a modular electrical power distribution system in accordance with an embodiment of the disclosure.

FIG. 18 illustrates a flow diagram of a process 320 of detecting one or more modules of a modular electrical power distribution system in accordance with an embodiment of the disclosure. The operations of process 320 may be implemented as software instructions executed by one or more logic devices associated with corresponding electronic devices, sensors, and/or structures depicted in FIGS. 1-14. More generally, the operations of process 320 may be implemented with any combination of software instructions and/or electronic hardware (e.g., inductors, capacitors, amplifiers, actuators, or other analog and/or digital components).

It should be appreciated that any step, sub-step, sub-process, or block of process 320 may be performed in an order or arrangement different from the embodiments illustrated in FIG. 18. For example, one or more blocks may be omitted from or added to process 320, such as any of blocks illustrated and described with reference to FIGS. 15-17. Furthermore, block inputs, block outputs, various sensor signals, sensor information, and/or other operational parameters may be stored to one or more memories prior to moving to a following portion of a corresponding process. Although process 320 is described with reference to power distribution system 100 and FIGS. 1-14, process 320 may be performed by other systems different from those systems and including a different selection of electronic devices, sensors, assemblies, mobile structures, and/or mobile structure attributes.

Referring to FIG. 18, the modular electrical power distribution system may be similar to power distribution system 100 described above. For example, the modular power distribution system may include a plurality of controllers in communication with one another via a shared serial communication bus and a module detection signal line. In block 322, process 320 includes receiving, by a controller of the plurality of controllers, an input detection signal from a preceding controller of the plurality of controllers along the shared serial communication bus. In some embodiments, the controller may receive the input detection signal via the module detection signal line. Depending on the application, the controller may be a load controller (e.g., first load controller 120 described above), and the preceding controller may be a master controller (e.g., master controller 106 described above). In some embodiments, the controller may be one load controller (e.g., second load controller 122 described above), and the preceding controller may be another load controller (e.g., first load controller 120 described above).

In block 324, process 320 includes sending, by the controller, a module identification signal to the master controller. For instance, the controller may send the module identification signal to the master controller via the shared serial communication bus. In some embodiments, the module identification signal may be sent by the controller in response to the controller receiving the input detection signal. The module identification signal may include information regarding the type of the controller, one or more ratings of the controller, a status of the controller, or other information about the controller.

In block 326, process 320 includes sending, by the controller, an output detection signal to a succeeding controller of the plurality of controllers along the shared serial communication bus. In some embodiments, the controller may send the output detection signal via the module detection signal line. Depending on the application, the succeeding controller may be a second load controller (e.g., second load controller 122 described above) or a power input controller (e.g., power input controller 108 described above).

In some embodiments, process 320 may include instantiating, by the master controller, the controller in a global configuration list (block 328). For example, block 328 may place the controller as a first controller/module, a second controller/module, or an nth controller/module in the global configuration list. In some embodiments, the controller may be instantiated in the global configuration list in response to the master controller receiving module identification signal. In some embodiments, process 320 may include sending, by the master controller, an acknowledgement signal to the controller (block 260). In some embodiments, the acknowledgement signal may be sent in response to the master controller receiving the module identification signal. The acknowledgement signal may confirm receipt of the module identification signal. In some embodiments, the acknowledgement signal may cause the controller to enter a passive mode awaiting a command that signifies the entire detection process is complete and that normal operation can be resumed.

Where applicable, various embodiments provided by the present disclosure can be implemented using hardware, software, or combinations of hardware and software. Also, where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine-readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A modular electrical power distribution system, comprising:
    a plurality of controllers coupled together, the plurality of controllers comprising a master controller, a power input controller, and one or more load controllers disposed between the master controller and the power input controller;
    a shared serial communication bus coupled between the plurality of controllers; and
    a module detection signal line coupled through the plurality of controllers,
    wherein each load controller comprises:
    a pair of prongs configured to interface with a succeeding controller of the plurality of controllers along the shared serial communication bus to partially define the module detection signal line and/or the shared serial communication bus with the succeeding controller;
    a pair of prong receptacles configured to interface with a preceding controller of the plurality of controllers along the shared serial communication bus to partially define the module detection signal line and/or the shared serial communication bus with the preceding controller;
    a first electrical connector configured to interface with the succeeding controller to partially define the module detection signal line and/or the shared serial communication bus with the succeeding controller; and
    a second electrical connector configured to interface with the preceding controller to partially define the module detection signal line and/or the shared serial communication bus with the preceding controller.

2. The modular electrical power distribution system of claim 1, wherein:
    the one or more load controllers comprise a first load controller and a second load controller stacked side-by-side; and
    the first electrical connector of the second load controller interfaces with the second electrical connector of the first load controller when the first load controller and the second load controller are stacked side-by-side.

3. The modular electrical power distribution system of claim 1, wherein:
    the master controller is stacked side-by-side with a first load controller of the one or more load controllers; and
    the master controller comprises a third electrical connector configured to interface with the first electrical connector of the first load controller when the first load controller and the master controller are stacked side-by-side.

4. The modular electrical power distribution system of claim 3,
    wherein:
    the power input controller is stacked side-by-side with a second load controller of the one or more load controllers; and
    the power input controller comprises a fourth electrical connector configured to interface with the second electrical connector of the second load controller when the second load controller and the master controller are stacked side-by-side.

5. The modular electrical power distribution system of claim 1, wherein each load controller further comprises:
    one or more bosses configured to interface with the succeeding controller to align and secure the succeeding controller; and
    one or more apertures configured to interface with the preceding controller to align and secure the preceding controller.

6. The modular electrical power distribution system of claim 5, wherein:
    the one or more load controllers comprise a first load controller and a second load controller stacked side-by-side;
    the pair of prongs of the first load controller interfaces with the pair of prong receptacles of the second load controller to define the module detection signal line and/or the shared serial communication bus between the first load controller and the second load controller;
    the first electrical connector of the first load controller interfaces with the second electrical connector of the second load controller to define the module detection signal line and/or the shared serial communication bus between the first load controller and the second load controller; and
    the one or more bosses of the first load controller interfaces with the one or more apertures of the second load controller to secure the first load controller to the second load controller.

7. The modular electrical power distribution system of claim 5, wherein:
    the master controller comprises a second pair of prongs configured to interface with the pair of prong receptacles of a load controller of the one or more load controllers; and
    the power input controller comprises a second pair of prong receptacles configured to interface with the pair of prongs of a load controller of the one or more load controllers.

8. The modular electrical power distribution system of claim 1, wherein the master controller comprises a logic device configured to:
- send, via the module detection signal line, a module detection signal to a first load controller of the one or more load controllers;
- receive, via the shared serial communication bus, a module identification signal from the first load controller; and
- instantiate the first load controller as a first module in a global configuration list.

9. The modular electrical power distribution system of claim 1, wherein each load controller of the one or more load controllers comprises a logic device configured to:
- receive, via the module detection signal line, a first module detection signal from a preceding controller of the plurality of controllers along the shared serial communication bus;
- send, via the shared serial communication bus, a module identification signal to the master controller; and
- send, via the module detection signal line, a second module detection signal to a succeeding controller of the plurality of controllers along the shared serial communication bus.

10. A method of detecting one or more characteristics of a modular electrical power distribution system comprising a plurality of controllers in communication with one another via a shared serial communication bus and a module detection signal line, the method comprising:
- sending, via the module detection signal line, a first module detection signal to a first load controller of the plurality of controllers;
- receiving, via the shared serial communication bus, a first module identification signal from the first load controller;
- receiving, via the shared serial communication bus, a second module identification signal from a second load controller of the plurality of controllers; and
- receiving, via the shared serial communication bus, a third module identification signal from a power input controller of the plurality of controllers.

11. The method of claim 10, further comprising:
- sending a first acknowledgement signal to the first load controller;
- sending a second acknowledgement signal to the second load controller; and
- sending a third acknowledgement signal to the power input controller.

12. The method of claim 10, further comprising:
- instantiating the first load controller as a first module in a global configuration list;
- instantiating the second load controller as a second module in the global configuration list; and
- terminating the detection process.

13. The method of claim 10, wherein:
- a master controller of the plurality of controllers asserts the first module detection signal to the first load controller to prompt the first load controller to send the first module identification signal to the master controller;
- the first load controller asserts a second module detection signal to the second load controller to prompt the second load controller to send the second module identification signal to the master controller; and
- the second load controller asserts a third module detection signal to the power input controller to prompt the power input controller to send the third module identification signal to the master controller.

14. A method of detecting one or more modules of a modular electrical power distribution system comprising a plurality of controllers in communication with one another via a shared serial communication bus and a module detection signal line, the method comprising:
- receiving, by a controller of the plurality of controllers and via the module detection signal line, an input detection signal from a preceding controller of the plurality of controllers along the shared serial communication bus;
- sending, by the controller via the shared serial communication bus, a module identification signal to a master controller; and
- sending, by the controller over the module detection signal line, an output detection signal to a succeeding controller of the plurality of controllers along the shared serial communication bus.

15. The method of claim 14, wherein:
- the controller is a load controller; and
- the preceding controller is the master controller.

16. The method of claim 15, wherein the succeeding controller is a second load controller.

17. The method of claim 14, wherein the succeeding controller is a power input controller.

18. The method of claim 14, further comprising instantiating, by the master controller, the controller in a global configuration list.

19. The method of claim 18, further comprising sending, by the master controller, an acknowledgement signal to the controller.

* * * * *

UNITED STATES PATENT AND TRADEMARK OFFICE
CERTIFICATE OF CORRECTION

PATENT NO. : 12,250,782 B2
APPLICATION NO. : 17/387967
DATED : March 11, 2025
INVENTOR(S) : Peter Long et al.

Page 1 of 1

It is certified that error appears in the above-identified patent and that said Letters Patent is hereby corrected as shown below:

In the Specification

Column 1, Line 15 change "U.S. patent application Ser. No." to --U.S. Patent Application No.--.

Column 3, Line 24 change "U.S. patent application Ser. No." to --U.S. Patent Application No.--.

Column 17, Line 5 change "U.S. patent application Ser. No." to --U.S. Patent Application No.--.

Column 17, Line 14 change "U.S. patent application Ser. No." to --U.S. Patent Application No.--.

Signed and Sealed this
Twenty-ninth Day of April, 2025

Coke Morgan Stewart
*Acting Director of the United States Patent and Trademark Office*